United States Patent [19]

Suhara et al.

[11] Patent Number: 5,976,198
[45] Date of Patent: Nov. 2, 1999

[54] SUBSTRATE TRANSFER AND BATH APPARATUS

[75] Inventors: Tadahiro Suhara, Kyoto; Kenji Sugimoto, Shiga-ken, both of Japan

[73] Assignee: Dainippon Screen Mfg. Co., Ltd., Japan

[21] Appl. No.: 08/659,687

[22] Filed: Jun. 6, 1996

[30] Foreign Application Priority Data

Jun. 9, 1995 [JP] Japan .................................. 7-143315
Jun. 26, 1995 [JP] Japan .................................. 7-159242

[51] Int. Cl.$^6$ .................................................. H01L 21/68
[52] U.S. Cl. ............................................................. 29/25.01
[58] Field of Search .......................... 29/25.01; 438/747, 438/753, 906, 908; 134/92

[56] References Cited

U.S. PATENT DOCUMENTS

| | | |
|---|---|---|
| 5,590,672 | 1/1997 | Ohmori et al. . |
| 5,603,777 | 2/1997 | Ohashi . |
| 5,647,914 | 7/1997 | Goto et al. . |
| 5,722,442 | 3/1998 | Hoffman et al. . |
| 5,730,162 | 3/1998 | Shindo et al. . |
| 5,741,367 | 4/1998 | Inada et al. . |

*Primary Examiner*—David E. Graybill
*Attorney, Agent, or Firm*—Ostrolenk, Faber, Gerb & Soffen, LLP

[57] ABSTRACT

The substrate processing apparatus comprises at least one chemical liquid bath for processing the substrate with a chemical liquid, and a multi-function processing bath for performing at least two of chemical liquid processing, cleaning with water and drying on the substrate which is processed with a chemical liquid within the chemical liquid bath.

44 Claims, 24 Drawing Sheets

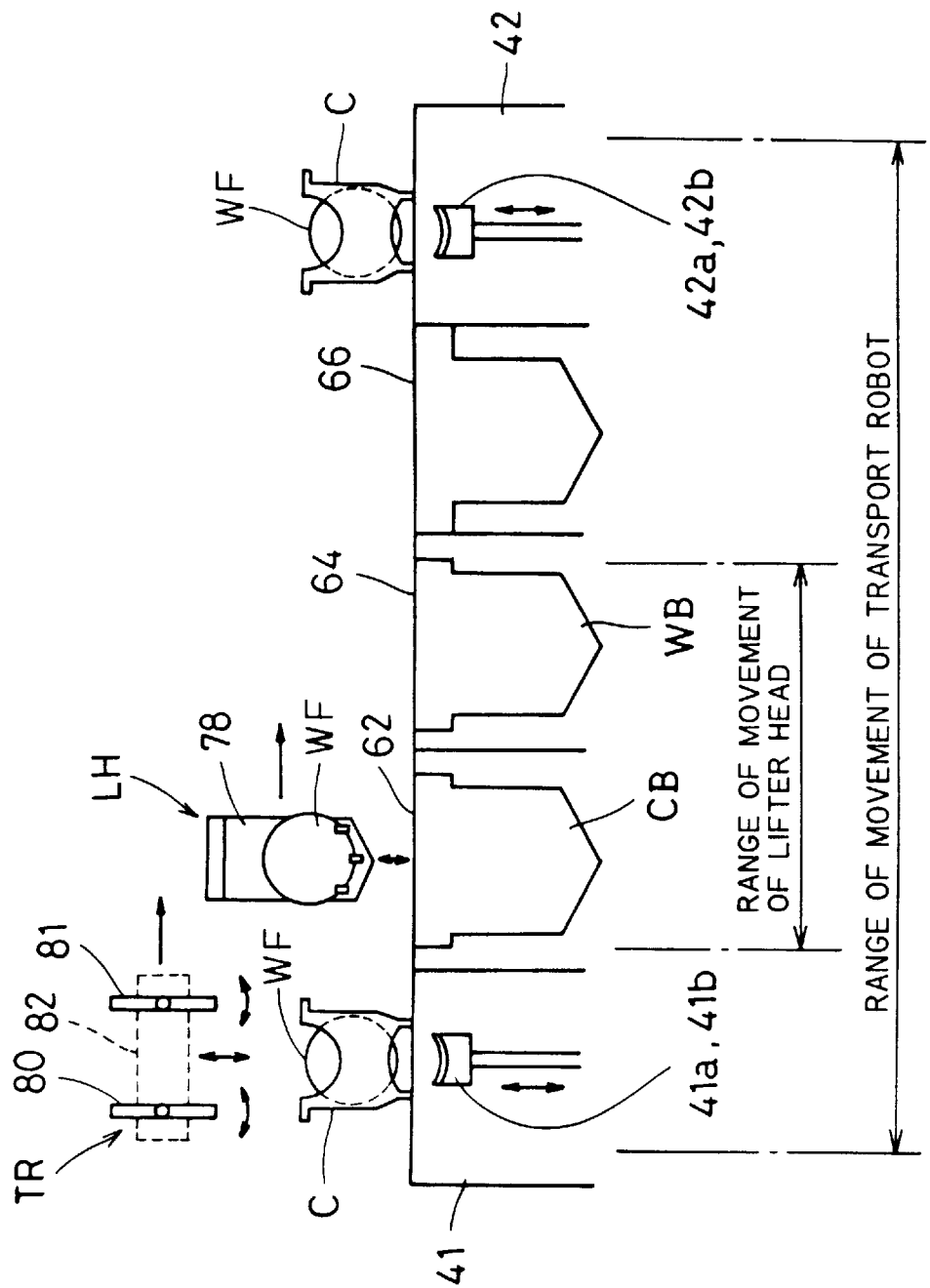

SUBSTRATE TRANSFER AND BATH APPARATUS

BACKGROUND OF THE INVENTION

1. Field of the Invention

The present invention relates to a substrate processing apparatus for dipping a thin plate-like substrate (hereinafter referred to simply as "substrate"), such as a semiconductor wafer and a glass plate for a liquid crystal display, into a processing liquid and for performing various types of processing, such as cleaning, on a surface of the substrate.

2. Description of the Prior Art

Conventional substrate processing apparatuses include a multiple-bath type processing apparatus for dipping a substrate sequentially into a plurality of processing baths each having only one function and for performing a series of treatments on the substrate, and a single-bath type processing apparatus for performing a series of treatments on a substrate which is put into only one bath which performs multiple functions while sequentially filling the bath with a processing liquid such as a chemical liquid and deionized water.

More specifically, the former multiple-bath type processing apparatus comprises one or more chemical processing baths for processing a substrate using one type of chemical liquid and one or more water cleaning baths. Through a plurality of steps of dipping a substrate sequentially into these baths in a predetermined order, contaminants at a surface of the substrate are removed, an oxide film at the surface of the substrate is etched, a resist film is removed, etc.

While a transport robot is used to transport a substrate sequentially to the respective baths during such steps, since a handling part of the transport robot holds a substrate which has just been processed with a chemical liquid or water, water or the chemical liquid adheres to the handling part. To deal with this, the substrate processing apparatus as described above comprises an exclusive cleaning part for cleaning and drying the handling part carrying water or the chemical liquid after a substrate is transferred.

On the other hand, the latter single-bath type processing apparatus comprises only one processing bath which is capable of performing both processing using a chemical liquid and cleaning with water. A chemical liquid and deionized water are alternately supplied in a predetermined order while holding a substrate within this only one processing bath, whereby contaminants at a surface of the substrate are removed, an oxide film at the surface of the substrate is etched, a resist film is removed, etc.

However, since transportation of a substrate from one bath to another is essential to the former apparatus, insufficient cleaning is likely to occur such as adhesion of particles and growth of an unnecessary film. Further, since it is necessary to dispose a number of processing baths, the size of the entire substrate processing apparatus inevitably increases.

In addition, since the former apparatus comprises the exclusive cleaning part for cleaning and drying the handling part of the transport robot, a foot space of the substrate processing apparatus increases. Further, since the former apparatus frequently requires the step of cleaning and drying the handling part, a throughput during processing of a substrate degrades. Still further, in the case of such an apparatus which directly holds a plurality of substrates with the handling part for simultaneous processing of the plurality of substrates, or in the case of such an apparatus which houses a plurality of substrates into a carrier and holds the carrier, it is difficult to perfectly clean and dry the handling part, and therefore, the substrates are likely to get contaminated by chemical liquid, etc. remaining on the handling port Beside, in the case of such an apparatus in which a lifter is disposed to each processing bath and a substrate is held inside and outside each processing bath, since the transport robot does not include a vertical movement mechanism and it is therefore necessary to dispose a mechanism for vertically moving the exclusive cleaning part for the handling part, the structure of the exclusive cleaning part becomes complex.

Meanwhile, although the latter apparatus does not have such problems as above with the former apparatus, since a step of replacing a chemical liquid within a bath with deionized water and thereafter replacing deionized water with other chemical liquid is essential in the latter apparatus, it takes time to adjust a temperature and hence a throughput becomes extremely low during processing which requires to use a chemical liquid at a high temperature or processing which requires to use a chemical liquid which demands fine adjustment of a temperature. Further, it takes time to adjust the density of a chemical liquid within a bath to a predetermined density and hence a throughput becomes extremely low during processing which requires to use a chemical liquid which has a high density.

SUMMARY OF THE INVENTION

Accordingly, an object of the present invention is to provide for a substrate processing apparatus which does not take a large space but has a high throughput.

Another object of the present invention is to provide for a substrate processing apparatus which does not need a cleaning part for cleaning a handling part of a transport robot.

Still another object of the present invention is to provide for a substrate processing apparatus which does not take a large space but performs excellent cleaning while preventing deterioration in a throughput even during processing using a chemical liquid at a high temperature, processing using a chemical liquid which demands fine adjustment of a temperature, or during processing using a chemical liquid which has a high density.

A substrate processing apparatus according to the present invention comprises: a first processing bath for performing chemical liquid processing on a substrate; a second processing bath for performing water rinse processing on the substrate; a transfer mechanism for transferring the substrate to the first and the second processing baths and receiving the substrate from these processing baths; and a dipping mechanism for dipping the substrate which is received from the transfer mechanism selectively into an optional one of the first and the second processing baths. This reduces a chance that a handling part of the transfer mechanism will directly touch a chemical liquid, and therefore, the apparatus does not need to comprise a cleaning part which cleans the handling part of the transfer mechanism. Hence, it is possible to complete the substrate processing apparatus into a small size which does not take a large space while suppressing creation of contaminants during processing of a substrate, and it is possible to increase a throughput during processing of a substrate.

In the apparatus as above, the transfer mechanism and the dipping mechanism may directly hold the substrate, or may hold a plurality of substrates through a carrier in which a plurality of substrate holding grooves are formed.

In the apparatus as above, since the transfer mechanism includes a pair of handling parts which can hold the substrate or a carrier, one of the handling parts may hold only the dry substrate or carrier as it is before chemical liquid processing while the other handling parts may hold only the substrate or carrier to which moisture adheres as it is after water rinsing processing. This allows the apparatus to omit a drying part which dries the handling part of the transfer mechanism.

In the apparatus as above, even when a plurality of chemical processing baths are disposed and a plurality types of chemical processing are performed within different baths, a chance that the handling part of the transfer mechanism will directly touch a chemical liquid is reduced, and therefore, the apparatus does not need to comprise a cleaning part which cleans the handling part of the transfer mechanism.

A substrate processing apparatus according to the present invention comprises: at least one chemical liquid exclusive bath for performing predetermined chemical liquid processing on a substrate; and a multi-function processing bath for performing at least two processes among chemical liquid processing, water rinsing and drying on the substrate which is processed through chemical liquid processing within the chemical liquid exclusive bath. Hence, the chemical liquid exclusive bath may be used during processing which uses a chemical liquid which is to be used at a high temperature, a chemical liquid which demands fine adjustment of a temperature, or a chemical liquid which is to be used at a high density, while the multi-function processing bath may be used during processing which uses a chemical liquid which does not have to be used at a high temperature, which does not demand fine adjustment of a temperature, and which does not have to be used at a high density. This prevents deterioration in a throughput and achieves excellent cleaning within a small space.

In the apparatus as above, when the multi-function processing bath is to perform drying, such as drying under reduced pressure, on the substrate, it is possible to complete drying without taking the substrate outside the bath, and therefore, it is possible to prevent disadvantages such as contamination due to atmosphere.

Further, when the apparatus as above is structured to comprise a circulation mechanism for discharging a chemical liquid out of the chemical liquid exclusive bath and for introducing the discharged chemical liquid into the chemical liquid exclusive bath once again and temperature adjusting means for adjusting the temperature of a chemical liquid, the circulation mechanism circulates a chemical liquid to thereby create convection of the chemical liquid within the chemical liquid exclusive bath, while the temperature adjusting means adjusts the temperature of the chemical liquid and controls the temperature of the chemical liquid within the chemical liquid exclusive bath. Thus, the temperature of the chemical liquid within the chemical liquid exclusive bath is maintained uniform and constant. This enables excellent processing of a substrate.

When the chemical liquid exclusive bath performs chemical liquid processing using an acid liquid of a high temperature within the apparatus as above, the chemical liquid processing using the high-temperature acid liquid, which requires to maintain the chemical liquid to a constant quality and at a uniform high temperature, is performed efficiently in an excellent manner.

When the chemical liquid exclusive bath performs chemical liquid processing using a chemical liquid made of mixture of sulfuric acid and a hydrogen perioxide liquid, phosphoric acid, sulfuric acid or nitric acid within the apparatus as above, the chemical liquid processing using the chemical liquid made of mixture of sulfuric acid and a hydrogen perioxide liquid, phosphoric acid, sulfuric acid or nitric acid, which requires to maintain the chemical liquid at a high temperature, is performed efficiently in an excellent manner.

When the chemical liquid exclusive bath performs chemical liquid processing using buffered hydrofluoric acid within the apparatus as above, the chemical liquid processing using buffered hydrofluoric acid, which requires to maintain the chemical liquid to a constant quality and at a uniform high temperature, is performed efficiently in an excellent manner.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram showing a front side structure of the substrate processing apparatus of FIG. 1;

DESCRIPTION OF THE PREFERRED EMBODIMENTS

<First Preferred Embodiment>

Figure 1:
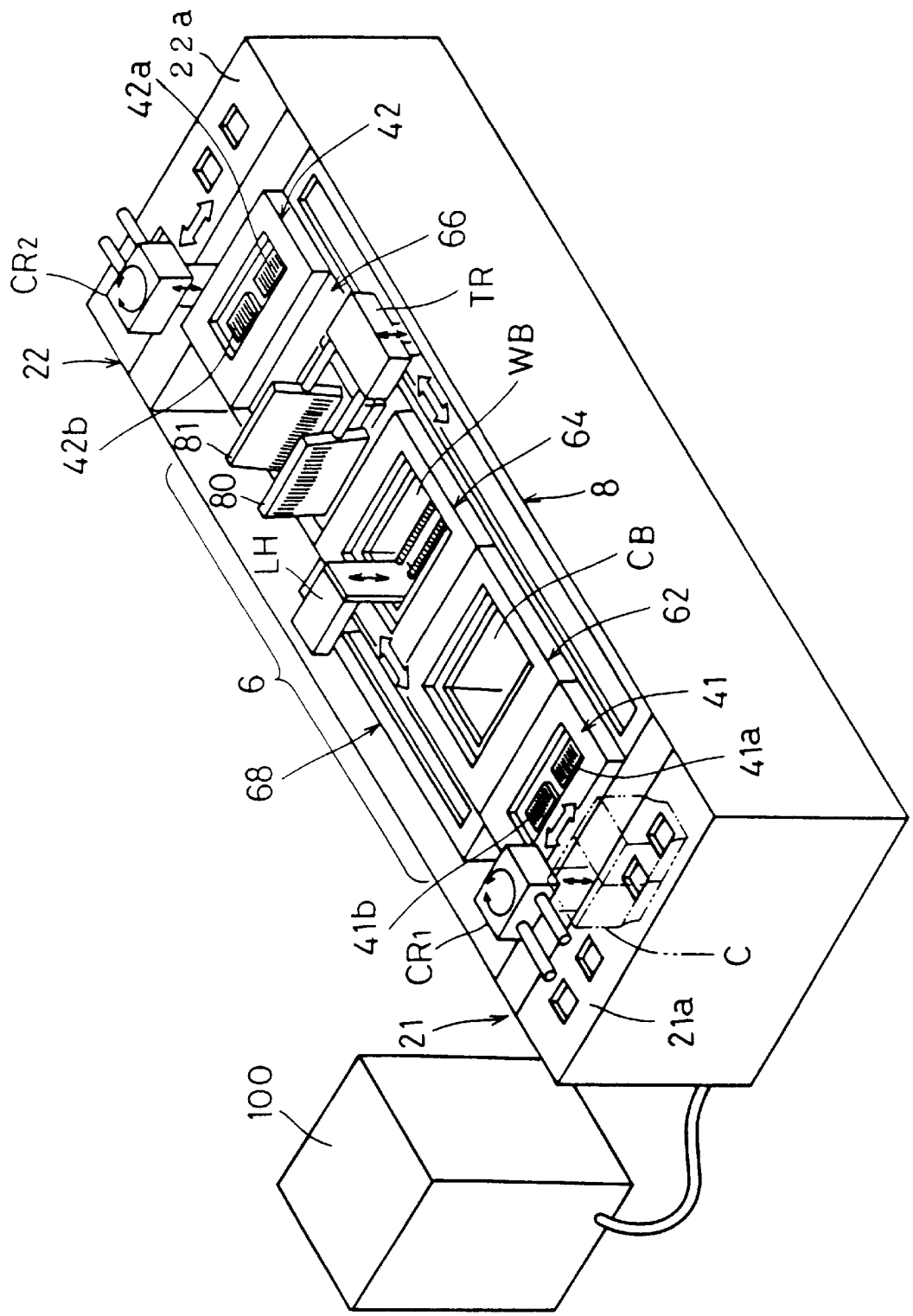
FIG. 1 is a perspective view showing an overall structure of a substrate processing apparatus according to a first preferred embodiment of the present invention.

As shown in FIG. 1, an apparatus comprises: a carrier loading part 21 for loading a carrier C which houses unprocessed substrates; a substrate removing part 41 which receives the carrier C from the carrier loading part 21 and simultaneously removes a plurality of substrates from the carrier C; a substrate processing part 6 which sequentially cleans unprocessed substrates which are removed from the carrier C; a substrate storing part 42 which simultaneously stores a plurality of processed cleaned substrates in a carrier and a carrier discharging part 22 which discharges the carrier in which the processed substrates are stored. Further, a substrate transfer/transport mechanism 8 is disposed across the substrate removing part 41 and the substrate storing part 42, within a front side portion of the apparatus, so as to transport and transfer yet-to-be-cleaned substrates, substrate under cleaning and cleaned substrates from one part to another. The substrate transfer/transport mechanism 8 and the other parts 6, 21, 22, 41 and 42 of this substrate processing apparatus operate under the control of a control apparatus 100.

The carrier loading part 21 includes a carrier transfer robot $CR_1$ which can move horizontally and vertically and rotate about a vertical axis, so as to transfer a pair of carriers C which is mounted at a predetermined position on a carrier stage 21a onto the substrate removing part 41.

The substrate removing part 41 includes a pair of holders 41a, 41b. The holders 41a and 41b are moved vertically by an actuator not shown. Guide grooves are formed in top surfaces of the holders 41a and 41b, which makes it possible to hold unprocessed substrates within the carriers C upright and parallel to each other. Hence, when the holders 41a and 41b are moved upward, the substrates are removed from the carriers C. The substrates which are removed from the carriers C are held by a pair of hands 80, 81 (FIG. 2) of a transport robot TR of the substrate transfer/transport mechanism 8, and held by and handed over to the substrate transfer/transport mechanism 8. After being moved in a horizontal direction, the substrates are loaded into the substrate processing part 6.

The substrate processing part 6 includes a chemical liquid processing part 62 which is equipped with a chemical liquid bath CB which contains sulfuric acid, ammonia, hydrochloric acid, hydrofluoric acid or the like, a water rinsing processing part 64 which is equipped with a water rinsing bath WB which contains deionized water, and a drying part 66 which incorporates a spin dryer.

In the substrate processing part 6, a substrate dipping mechanism 68 is disposed behind the chemical liquid processing part 62 and the water rinsing processing part 64. By means of a lifter head LH which is disposed to the substrate dipping mechanism 68 for free movement in the vertical direction and side to side, substrates which are received from the transport robot TR are dipped into the chemical liquid bath CB of the chemical liquid processing part 62 or into the water rinsing bath WB of the water rinsing processing part 64.

The substrate storing part 42 has a similar structure to the substrate removing part 41. Using a pair of holders 42a, 42b which can move in the vertical direction, the substrate storing part 42 has receives processed substrates which are held by the transport robot TR and places the substrates into the carriers C. The carrier discharging part 22 has a similar structure to the carrier loading part 21. The carrier discharging part 22 includes a carrier transfer robot $CR_2$ which can freely move, so as to transfer a pair of carriers which is mounted on the substrate storing part 42 to a predetermined position on a carrier stage 22a.

Figure 2:
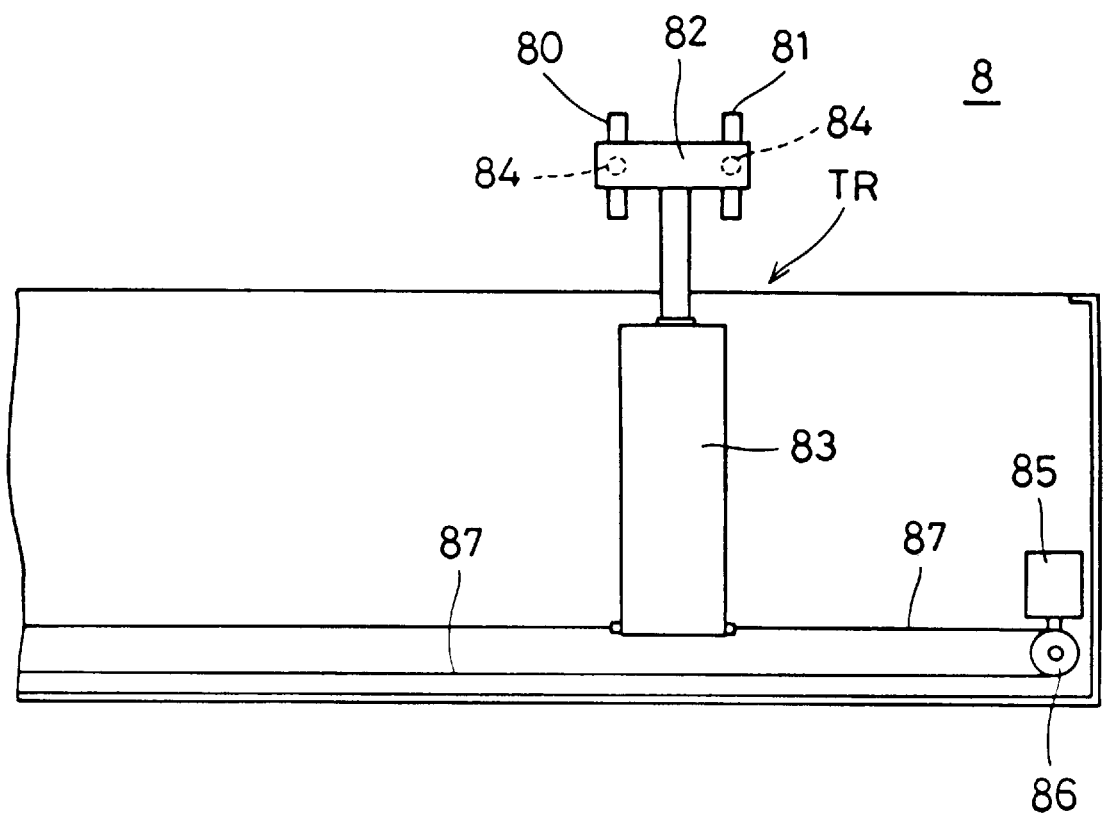
FIG. 2 is a partial cross sectional view for describing a substrate transfer/transport mechanism.

FIG. 2 is a partial cross sectional view for describing a front side structure of the substrate transfer/transport mechanism 8. Guided along a guide rail (not shown), the transport robot TR is movable in the horizontal direction. The transport robot TR is fixed to a timing belt 87 which runs about a pulley 86, which rotates when driven by a motor 85, so as to reciprocally move between optional horizontal positions. A head 82 of the transport robot TR is driven by an actuator 83 to move in the vertical direction between optional positions. If the pair of holders 42a, 42b and the like (i.e., a part to which substrates are handed over or from which substrates are received.) are adjustable with respect to their height, it is not always necessary to move the head 82 in the vertical direction during the substrate transfer operation. A pair of hands 80, 81 extend in the horizontal direction from the head 82. When driven by a driving mechanism which is disposed within the head 82, the hands 80 and 81 rotate around respective rotation shafts 84 in synchronization to each other.

Figure 3A:
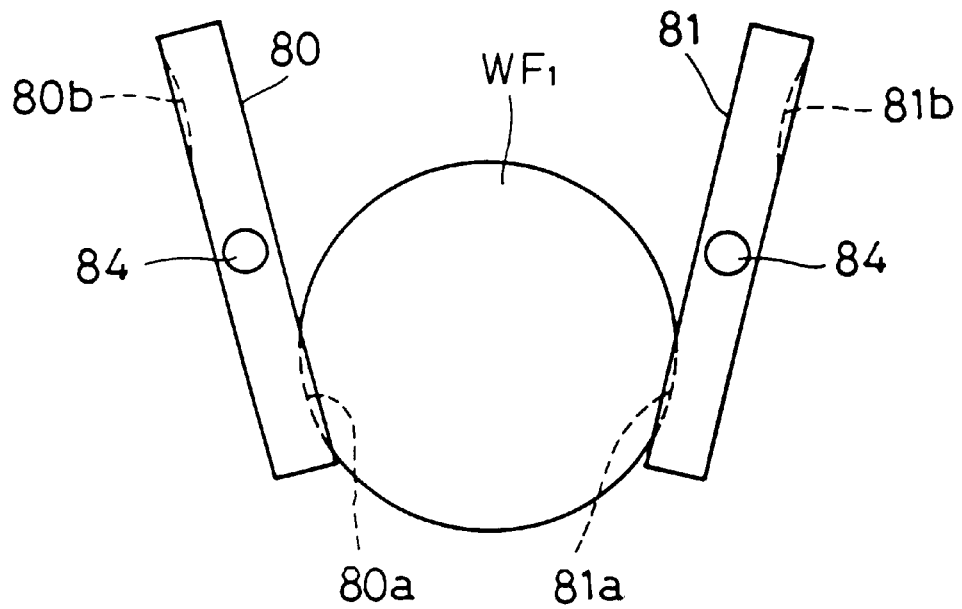
FIG. 3A is a diagram for describing a transport robot of a substrate hold/transfer part as it holds a dry substrate.
Figure 3B:
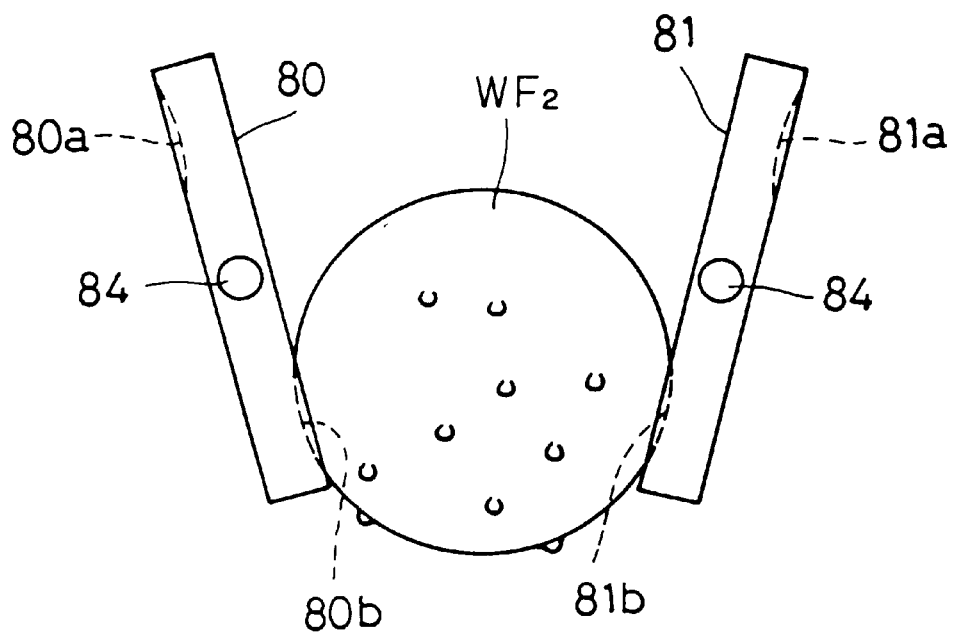
FIG. 3B is a diagram for describing the transport robot of the substrate hold/transfer part as it holds a wet substrate.

FIGS. 3A and 3B are diagrams for describing a structure and a detailed operation of a pair of hands 80, 81 of the transport robot TR. FIG. 3A shows a plurality of dried substrates $WF_1$ as they are held by a first handling part, i.e., a pair of dry side guide grooves 80a, 81a, while FIG. 3B shows a plurality of substrates $WF_2$ to which deionized water adheres as they are held by a second handling part, i.e., a pair of wet side guide grooves 80b, 81b. As shown in FIG. 3A, when the dried substrates $WF_1$ are handled, the dry side guide grooves 80a and 81a, which are formed in faced surfaces of the hands 80 and 81 of one edge side at equal intervals and parallel to each other, hold the dried substrates $WF_1$ upright and at equal intervals. When the substrates $WF_2$ to which deionized water adheres are handled as shown in FIG. 3B, the hands 80 and 81 are rotated 180 degrees about the horizontal rotation shafts 84 and 84, respectively, each from the state shown in FIG. 3A. The wet side guide grooves 80b and 81b, which are formed in faced surfaces of the hands 80 and 81 of the other edge side at equal intervals and parallel to each other, then hold the substrates $WF_2$, to which deionized water from the water rinsing processing part 64 adheres, upright and at equal intervals. In this manner, the dry side guide grooves 80a and 81a hold only the dried substrates $WF_1$, while the wet side guide grooves 80b and 81b hold only the substrates $WF_2$ to which deionized water adheres. Using the handling parts selectively, it is not always necessary to dry and clean the pair of hands 80, 81.

Figure 4:
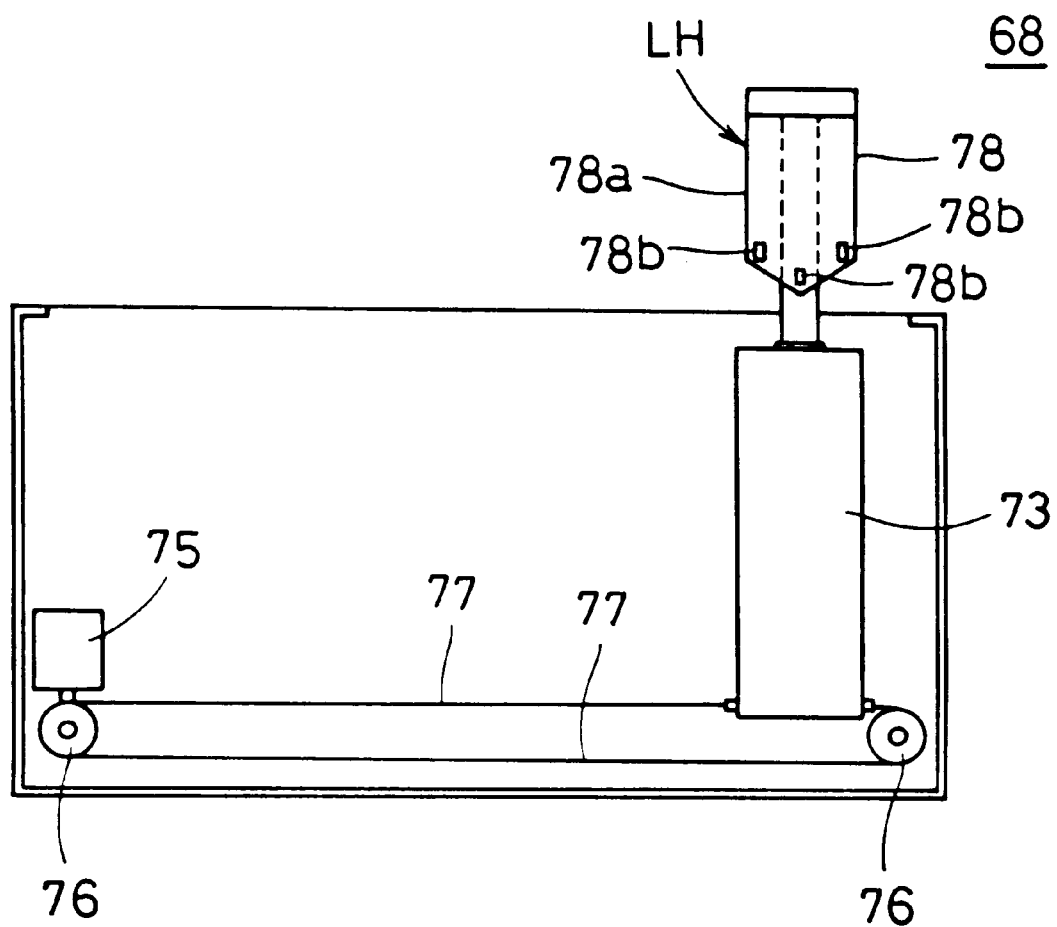
FIG. 4 is a partial cross sectional view for describing a substrate dipping mechanism.
Figure 6A:
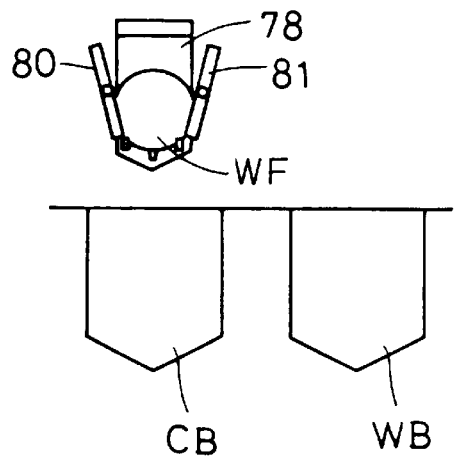
FIGS. 6A to 6F are diagrams for describing operations of the substrate processing apparatus of FIG. 1.
Figure 6D:
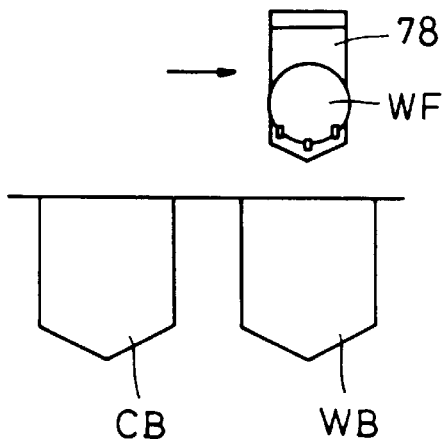
Figure 6B:
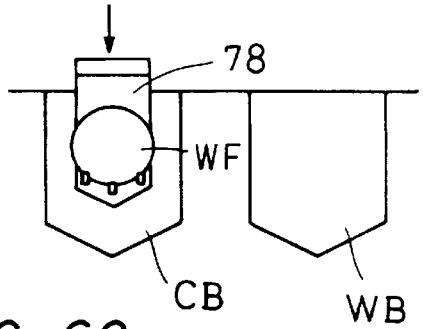
Figure 6E:
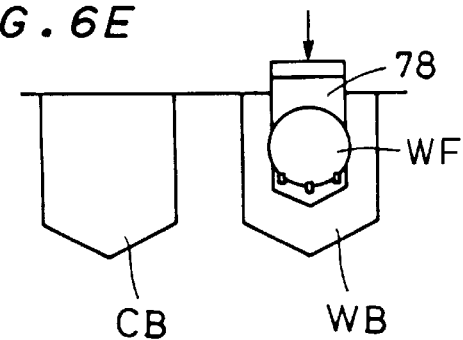
Figure 6C:
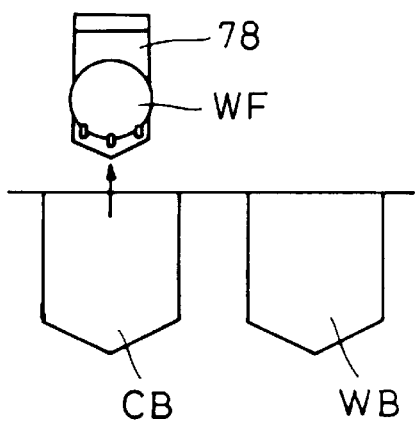
Figure 6F:
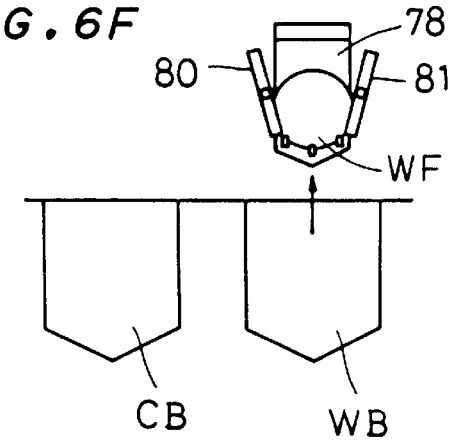

FIG. 4 is a partial cross sectional view for describing a front side structure of the substrate dipping mechanism 68. Driven by an actuator 73, the lifter head LH moves between various vertical positions. The actuator 73, guided along a guide rail not shown, is movable in the horizontal direction. The actuator 73 is fixed to a timing belt 77 which runs about a pulley 76, which rotates when driven by a motor 75, so as to reciprocally move between desired horizontal positions. Hence, the lifter head LH can move not only in the vertical direction to thereby dip substrates into the chemical liquid bath CB and the water rinsing bath WB which are shown in FIG. 1, but also in the horizontal direction to thereby move substrates from the chemical liquid processing part 62 to the water rinsing processing part 64, so that it is possible to dip substrates which were once dipped into the chemical liquid bath CB into the water rinsing bath WB subsequently.

The lifter head LH includes a substrate holding member 78 of a chemical-resistant material, and the substrate holding member 78 holds substrates and is dipped into the chemical liquid bath CB and the water rinsing bath WB together with the substrates. The substrate holding member 78 includes a vertical plate 78a which serves as a main part and three holder bars 78b, 78b, 78b which extend from a lower end side of the vertical plate 78a in the horizontal direction. Grooves for holding substrates upright are formed at equal intervals on each holder bar 78b. By means of cooperation between the three holder bars 78b, 78b, 78b, substrates are held at three points on the lower end side.

FIG. 5 is a view diagrammatically showing a front side structure of the substrate processing apparatus of FIG. 1. An operation of the substrate processing apparatus of FIG. 1 will be described with reference to FIG. 5. Substrates WF within the carrier C on the substrate taking part 41 are taken out from the carrier C by the pair of holders 41a, 41b which moves upward, held by the pair of hands 80, 81 of the transport robot TR, and then transferred to the pair of hands 80, 81. The substrates WF which are held by the pair of hands 80, 81 are transported in the horizontal direction and handed over to the substrate holding member 78 of the lifter head LH. The substrates WF which are held by the substrate holding member 78 of the lifter head LH are directly dipped into the chemical liquid bath CB of the chemical liquid processing part 62. After treated by chemical liquid processing, the substrates WF are dipped into the water rinsing bath WB of the water rinsing processing part 64 to be rinseed with water. Following this, the water-rinseed substrates WF are handed over to the pair of hands 80, 81 of the transport robot TR from the substrate holding member 78 of the lifter head LH, and transferred to the drying part 66 to be dried thereat. Lastly, the dried substrates WF are handed over to the pair of hands 80, 81 of the transport robot TR, and thereafter further to the pair of holders 42a, 42b of the substrate storing part 42, and housed into the carrier C.

Chemical liquid processing and water rinsing processing may be repeatedly performed. That is, the lifter head LH may reciprocally circulate when necessary to thereby repeat the operation of dipping the substrate holding member 78 as it holds substrates WF into the water rinsing bath WB after dipping the same into the chemical liquid bath CB, so that the effect of cleaning is enhanced. During such a repeated operation, a chemical liquid within the chemical liquid bath CB may be replaced with other type of chemical liquid. This enables to perform various treatments on substrates WF.

FIGS. 6A to 6F are diagrams for further specifically describing operations of the substrate holding member 78 which is disposed to the lifter head LH. Substrates WF which are held by the pair of hands 80, 81 (i.e., the handling part of the dry side shown in FIG. 3A, in this case) of the transport robot TR are transferred to the substrate holding member 78 of the lifter head LH which is at a first retrieval position above the chemical liquid bath CB (See FIG. 6A). The substrate holding member 78 which holds the substrates WF moves downward to a first dipping position inside the chemical liquid bath CB from the first retrieved position (See FIG. 6B). The substrate holding member 78 which now holds the substrates WF which were processed by chemical liquid processing moves upward from the first dipping position to a first retrieval position above the chemical liquid bath CB (See FIG. 6C). The substrate holding member 78 which holds the substrates WF moves to the side from the first retrieval position above the chemical liquid bath CB to a second retrieval position above the water rinsing bath WB (See FIG. 6D). The substrate holding member 78 which holds the substrates WF moves downward from the second retrieval position to a second dipping position inside the water rinsing bath WB (See FIG. 6E). The substrate holding member 78 which now holds the substrates WF which were rinsed with water moves upward from the second dipping position to a second retrieval position above the water rinsing bath WB, and transfers the substrates WF to the pair of hands 80, 81 (i.e., the handling part of the water carrying side shown in FIG. 3B, in this case) of the transport robot TR (See FIG. 6F). Through such an operation, the substrate holding member 78 always receives the substrates WF which are rinseed with water from the pair of hands 80, 81 while the pair of hands 80, 81 always receives the substrates WF which are rinseed with water from the substrate holding member 78. This eliminates the necessity of cleaning the pair of hands 80, 81 after every processing of the substrates WF, improves the throughput, and omits a mechanism for cleaning only the handling parts for the sake of reduction of the space.

<Second Preferred Embodiment>

Figure 7:
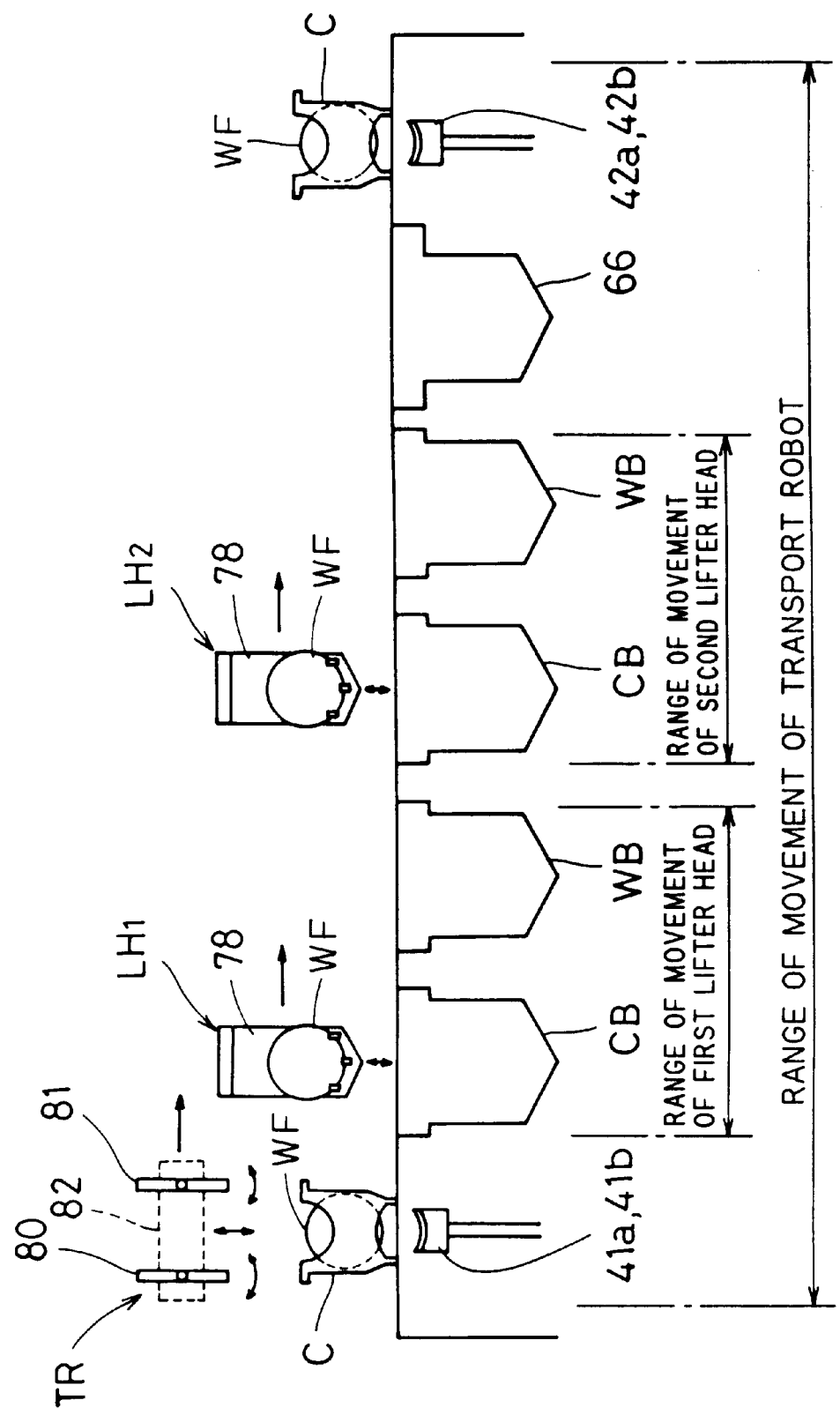
FIG. 7 is a diagram showing a front side structure of a substrate processing apparatus according to a second preferred embodiment.

FIG. 7 is a diagram showing a front side structure of a substrate processing apparatus according to a second preferred embodiment. The second preferred embodiment is modification of the first preferred embodiment, and therefore, similar reference symbols will be assigned to portions which are common to the first preferred embodiment and a redundant description will be simply omitted.

As shown in FIG. 7, the substrate processing apparatus according to the second preferred embodiment comprises two processing units where each processing unit consists of the chemical liquid bath CB and the water rinsing bath WB. A first substrate dipping mechanism which includes a first lifter head $LH_1$ is disposed to one of the processing units. A second substrate dipping mechanism which includes a second lifter head $LH_2$ is disposed to the other one of the processing units.

Now, an operation will be briefly described. Substrates WF within the carrier C are removed by the pair of holders 41a, 41b. The substrates WF are then held by and handed over to the pair of hands 80, 81 of the transport robot TR. The substrates WF which are held by the pair of hands 80, 81 are transported in the horizontal direction and received by the substrate holding member 78 of the first lifter head $LH_1$. The substrates WF which are held by the substrate holding member 78 are dipped into the chemical liquid bath CB and processed with a chemical liquid in the bath CB. The substrates WF are then dipped into the adjacent water rinsing bath WB and rinsed with water. This completes processing in the front processing unit. Next, after the substrates WF which are rinsed with water are handed over from the substrate holding member 78 of the first lifter head $LH_1$ to the pair of hands 80, 81 of the transport robot TR, the substrates WF are handed over to the substrate holding member 78 of the second lifter head $LH_2$. The substrates WF which are held by this substrate holding member 78 are dipped into the chemical liquid bath CB and processed with a chemical liquid in the bath CB. Following this, the substrates WF are then dipped into the adjacent water rinsing bath WB and rinsed with water. This completes processing in the rear processing unit. Next, the substrates WF which are rinsed with water are handed over from the substrate holding member 78 of the second lifter head $LH_2$ to the pair of hands 80, 81 of the transport robot TR. The substrates WF which are held by the pair of hands 80, 81 are transferred to the drying part 66 to be dried thereat. Lastly, the dried substrates WF are handed over to the pair of hands 80, 81 of the transport robot TR, and thereafter further to the pair of holders 42a, 42b, and housed into the carrier C.

As clearly understood from the above, in the substrate processing apparatus according to the second preferred embodiment, the pair of hands 80, 81 of the transport robot TR always receives water-rinsed substrates WF from the substrate holding member 78 of the second lifter head $LH_2$. Hence, it is not necessary to clean the pair of hands 80, 81 every time substrates WF are processed.

<Third Preferred Embodiment>

Figure 8:
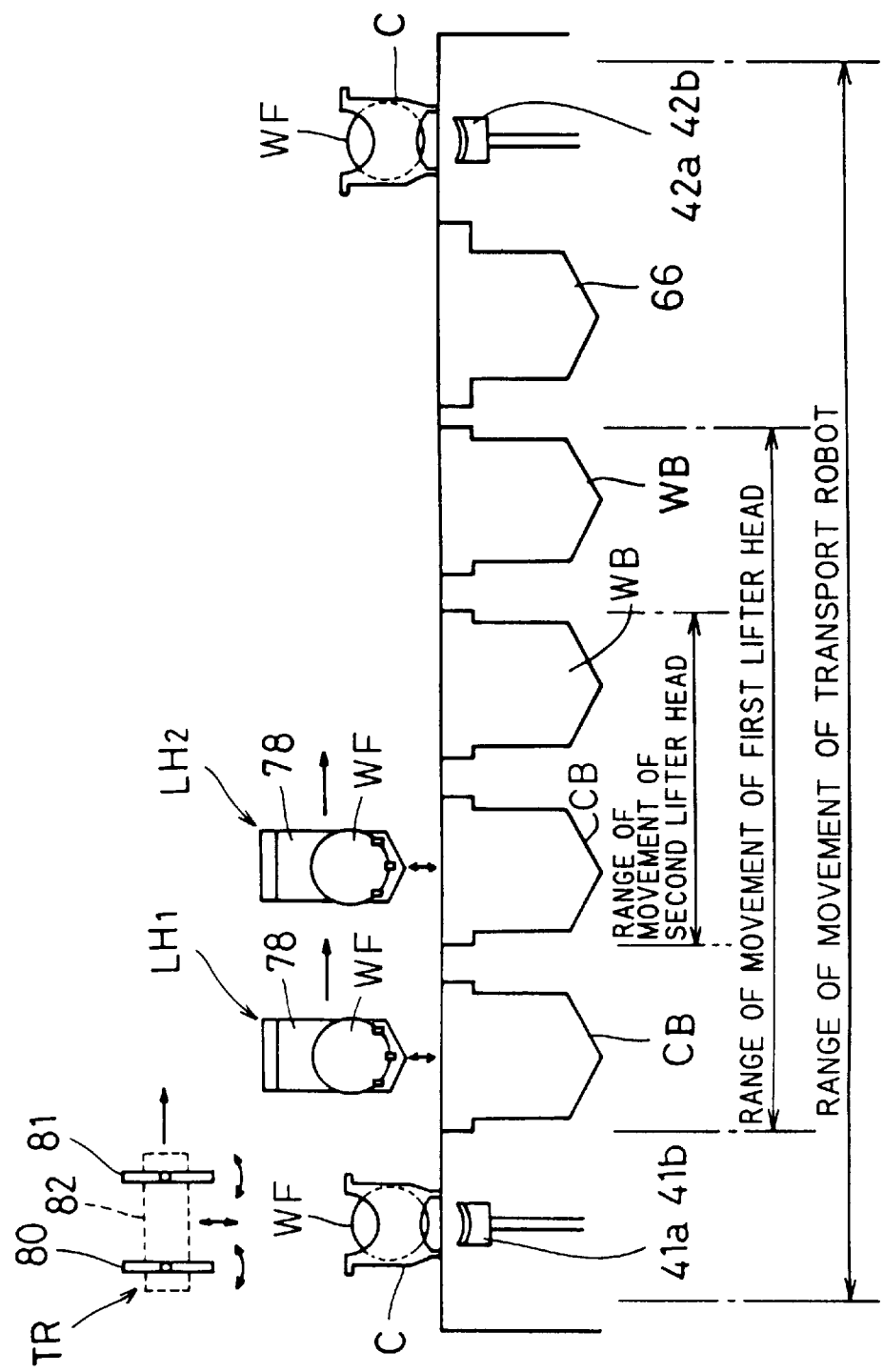
FIG. 8 is a diagram showing a front side structure of a substrate processing apparatus according to a third preferred embodiment.

FIG. 8 is a diagram showing a front side structure of a substrate processing apparatus according to a third preferred embodiment. The third preferred embodiment is modification of the second preferred embodiment.

The substrate processing apparatus according to the third preferred embodiment is identical to the substrate processing apparatus according to the second preferred embodiment in that the apparatus comprises two processing units where each processing unit consists of the chemical liquid bath CB and the water rinsing bath WB. However, one of the processing units is separated and disposed at outermost with a distance, and the other processing unit which is disposed at the center. The first substrate dipping mechanism which includes the first lifter head $LH_1$ is disposed to the processing unit which is located at the outermost position, while the second substrate dipping mechanism which includes the second lifter head $LH_2$ is disposed the other processing unit of the center. To prevent the two lifter heads $LH_1$ and $LH_2$ from interfering each other, the height of a lower edge of the first lifter head $LH_1$ is set higher than the height of an upper edge of the second lifter head $LH_2$, for example, by locating the second lifter head $LH_2$ at the dipping position within the bath CB or the bath WB while the first lifter head $LH_1$ is moving to the side.

Now, an operation will be briefly described. Substrates WF within the carrier C are taken out by the pair of holders 41a, 41b. The substrates WF are then held by and handed over to the pair of hands 80, 81 of the transport robot TR. The substrates WF which are held by the pair of hands 80, 81 are transported in the horizontal direction and received by the substrate holding member 78 of the first lifter head $LH_1$. The substrates WF which are held by the substrate holding member 78 are dipped into the chemical liquid bath CB (i.e., the outer bath on the left-hand side in FIG. 8) and processed with a chemical liquid in the bath CB. The substrates WF are then dipped into the water rinsing bath WB (i.e., the outer bath on the right-hand side in FIG. 8) which is spaced apart from the chemical liquid bath CB and rinsed with water. Next, after the water-rinsed substrates WF are handed over from the substrate holding member 78 of the first lifter head $LH_1$ to the pair of hands 80, 81 of the transport robot TR, the substrates WF are handed over to the substrate holding member 78 of the second lifter head $LH_2$. The substrates WF which are held by this substrate holding member 78 are dipped into another chemical liquid bath CB (i.e., the left one of the baths at the center) and processed with a chemical liquid in the bath CB. Following this, the substrates WF are then dipped into the adjacent water rinsing bath WB (i.e., the right-hand side one of the baths at the center in FIG. 8) and rinsed with water. Next, the substrates WF which are rinsed with water are handed over from the substrate holding member 78 of the second lifter head $LH_2$ to the pair of hands 80, 81 of the transport robot TR. The substrates WF which are held by the pair of hands 80, 81 are transferred to the drying part 66 to be dried thereat. Lastly, the dried substrates WF are handed over to the pair of hands 80, 81 of the transport robot TR, and thereafter further to the pair of holders 42a, 42b, and housed into the carrier C.

<Fourth Preferred Embodiment>

Figure 9:
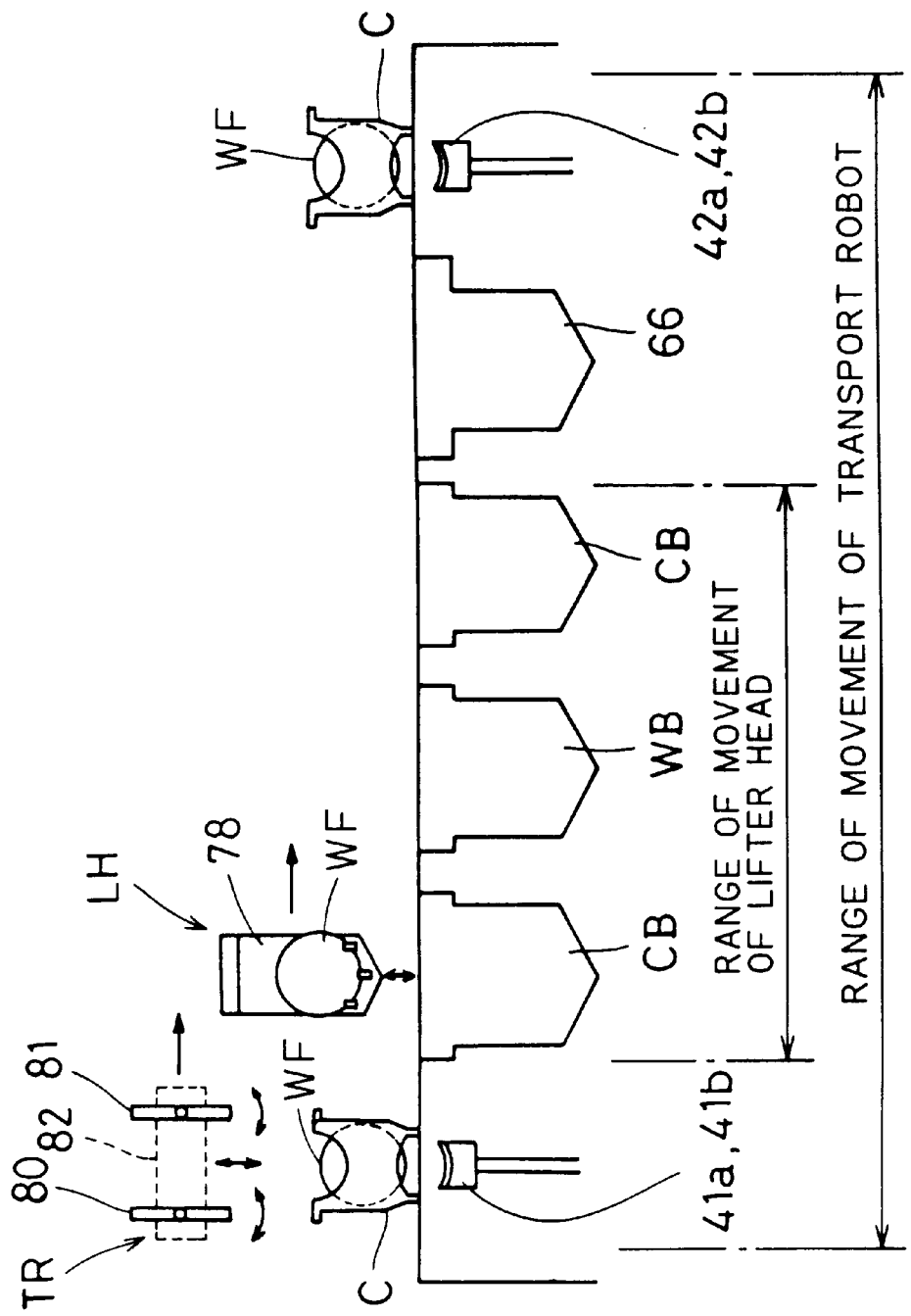
FIG. 9 is a diagram showing a front side structure of a substrate processing apparatus according to a fourth preferred embodiment.

FIG. 9 is a diagram showing a front side structure of a substrate processing apparatus according to a fourth preferred embodiment. The fourth preferred embodiment is modification of the first preferred embodiment.

In the substrate processing apparatus according to the fourth preferred embodiment, two chemical liquid baths CB and one water rinsing bath WB serve as one processing unit. The two chemical liquid baths CB are disposed on opposite sides of the water rinsing bath WB. A substrate dipping mechanism which includes the lifter head LH which moves to the side along the entire length of the processing unit is disposed to the processing unit.

Now, an operation will be briefly described. Substrates WF within the carrier C are removed by the pair of holders 41a, 41b. The substrates WF are then held by and handed over to the pair of hands 80, 81 of the transport robot TR. The substrates WF which are held by the pair of hands 80, 81 are transported in the horizontal direction and received by the substrate holding member 78 of the lifter head LH. The substrates WF which are held by the substrate holding member 78 are dipped into the chemical liquid bath CB (i.e., the outer bath on the left-hand side in FIG. 9) and processed with a chemical liquid in the bath CB. The substrates WF are then dipped into the adjacent water rinsing bath WB and rinsed with water. Next, the water-rinsed substrates WF which are held by the substrate holding member 78 are dipped into another chemical liquid bath CB (i.e., the outer bath on the right-hand side in FIG. 9) and processed with a chemical liquid in the bath CB. Following this, the substrates WF are dipped into the same water rinsing bath WB which is adjacent to this chemical liquid bath CB and rinsed with water. Next, the water-rinsed substrates WF are handed over from the substrate holding member 78 of the lifter head LH to the pair of hands 80, 81 of the transport robot TR. The substrates WF which are held by the pair of hands 80, 81 are transferred to the drying part 66 to be dried thereat. Lastly, the dried substrates WF are handed over to the pair of hands 80, 81 of the transport robot TR, and thereafter further to the pair of holders 42a, 42b, and housed into the carrier C.

<Fifth Preferred Embodiment>

Figure 10:
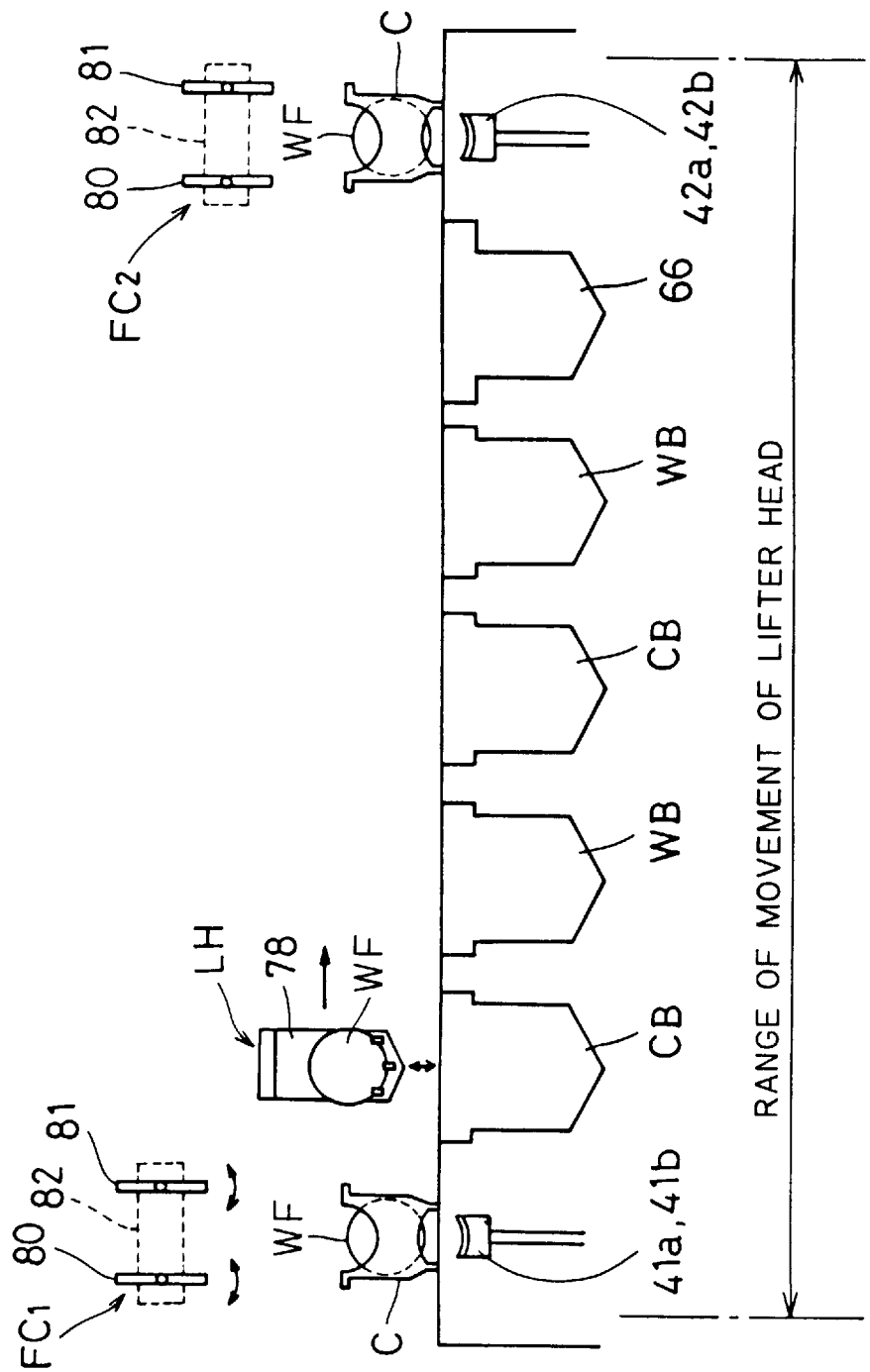
FIG. 10 is a diagram showing a front side structure of a substrate processing apparatus according to a fifth preferred embodiment.

FIG. 10 is a diagram showing a front side structure of a substrate processing apparatus according to a fifth preferred embodiment. The fifth preferred embodiment is modification of the first preferred embodiment.

The substrate processing apparatus according to the fifth preferred embodiment comprises two processing units where each processing unit consists of the chemical liquid bath CB and the water rinsing bath WB. Each processing unit includes a substrate dipping mechanism which includes the lifter head LH which moves to the side along the entire length of the processing unit. Further, a pair of fixing chucks $FC_1$, $FC_2$ is used instead of the transport robot TR.

These fixing chucks $FC_1$ and $FC_2$ each only hold substrates WF by opening and closing the pair of hands 80, 81 of a head 82 of each chuck, but do not transport substrates WF.

Now, an operation will be briefly described. Substrates WF within the carrier C are removed by the pair of holders 41a, 41b. The substrates WF are then held by and handed over to the pair of hands 80, 81 of the fixing chuck $FC_1$. Next, the lifter head LH moves below the fixing chuck CF1, and the substrates WF which are held by the pair of hands 80, 81 are handed over to the substrate holding member 78 of the lifter head LH. The substrates WF which are held by the substrate holding member 78 are dipped into the chemical liquid bath CB (i.e., the outer bath on the left-hand side in FIG. 10) and processed with a chemical liquid in the bath CB. The substrates WF are then dipped into the adjacent water rinsing bath WB (i.e., the left one of the baths at the center in FIG. 10) and rinsed with water. Next, the water-rinsed substrates WF which are held by the substrate holding member 78 are dipped into another adjacent chemical liquid bath CB (i.e., the right-hand side one of the baths at the center in FIG. 10) and processed with a chemical liquid in the bath CB. Following this, the substrates WF are dipped into the adjacent water rinsing bath WB (i.e., the outer bath on the right-hand side in FIG. 10) and rinsed with water. Next, the substrates WF which are held by the substrate holding member 78 are transferred to the drying part 66 to be dried thereat. Since it is necessary to hold the substrates WF by the substrate holding member 78 of the lifter head LH in the drying part 66, the drying part 66 is not a spin dryer. Lastly, after the dried substrates WF are handed over to the pair of hands 80, 81 of the fixing chuck $FC_2$ from the substrate holding member 78 of the lifter head LH, and thereafter further to the pair of holders 42a, 42b, and housed into the carrier C.

While the foregoing has described the invention in relation to the first to the fifth preferred embodiments, the present invention is not limited to the preferred embodiments above. Rather, it is possible to combine a plurality of the various types of the processing units as described in relation to the preferred embodiments above, i.e., those consisting of two baths of one chemical liquid bath CB and one water rinsing bath WB or those consisting of three or more baths including these baths CB and a water rinsing bath WB, and those including substrate dipping mechanisms which include the lifter heads LH, $LH_1$, $LH_2$ which move to the side along the entire range of the substrate dipping mechanism, depending on the necessity. This eliminates the necessity of cleaning the pair of hands 80, 81 of the transport robot TR at each stage of processing substrates WF, even when various types of substrate processing are necessary.

<Sixth Preferred Embodiment>

Figure 11:
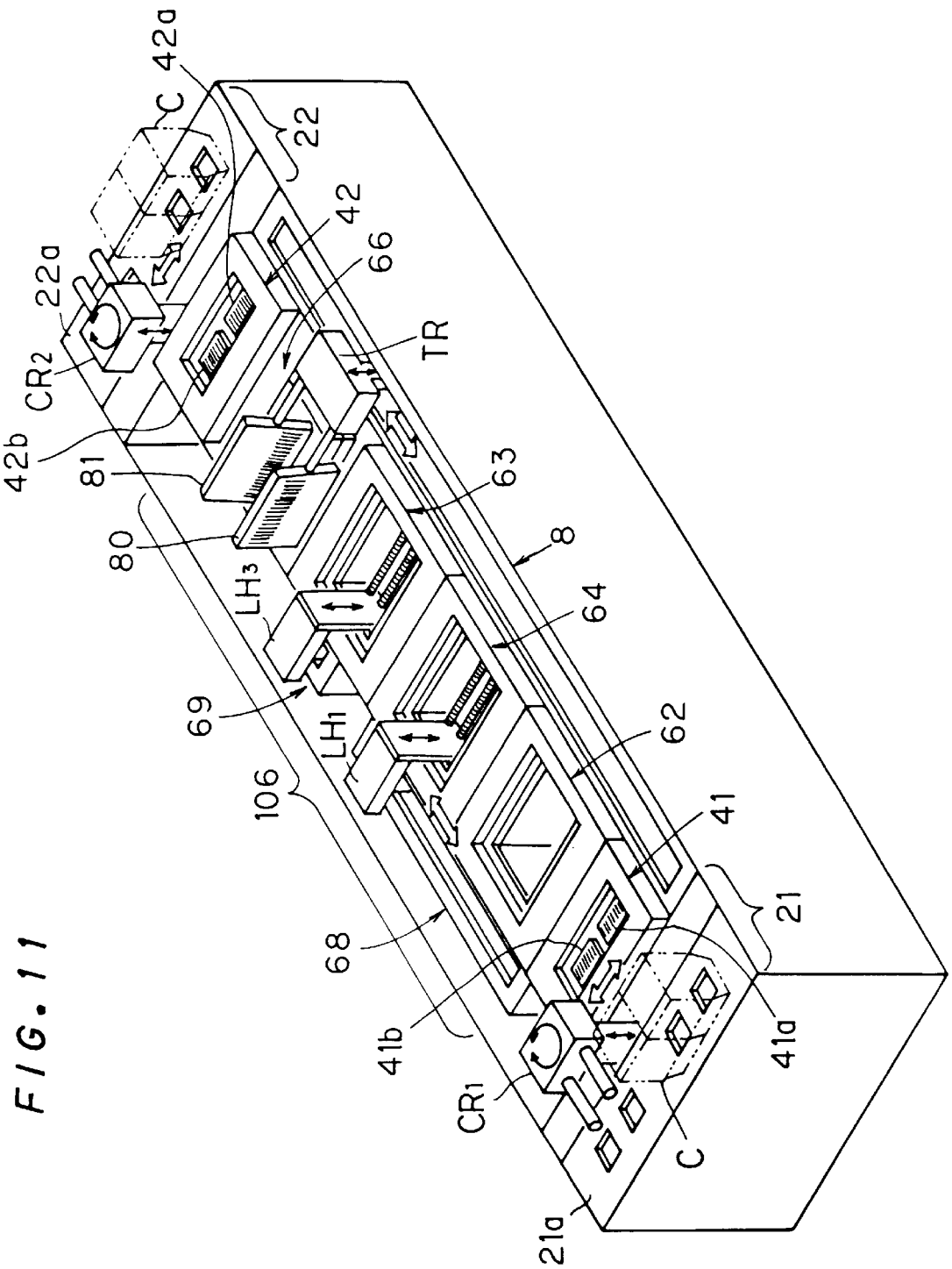
FIG. 11 is a perspective view showing an overall structure of a substrate processing apparatus according to a sixth preferred embodiment.

FIG. 11 is a perspective view showing a structure of the substrate processing apparatus according to a sixth preferred embodiment. As shown in FIG. 11, this apparatus comprises: a carrier loading part 21 for loading a carrier C which houses unprocessed substrates; a substrate removing part 41 which receives the carrier C from the carrier loading part 21 and simultaneously removes a plurality of substrates from the carrier C; a substrate processing part 106 which sequentially cleans unprocessed substrates which are removed from the carrier C; a substrate storing part 42 which simultaneously stores a plurality of processed cleaned substrates in a carrier; and a carrier discharging part 22 which discharges the carrier which stores the processed substrates. Further, the substrate transfer/transport mechanism 8 is disposed across the substrate removing part 41 and the substrate storing part 42, within a front side portion of the apparatus, so as to transport and transfer yet-to-be-cleaned substrates, substrate under cleaning and cleaned substrates from one part to another.

The carrier loading part 21, the substrate removing part 41, the substrate processing part 106 and the carrier discharging part 22 are similar to those of the first preferred embodiment, and therefore, will not be described.

The substrate processing part 106 is formed by a chemical liquid processing part 62 which includes a chemical liquid bath CB which contains a chemical liquid, a water rinsing processing part 64 which includes a water rinsing bath WB which contains deionized water, a multi-function processing part 63 which includes a multi-function processing bath OB within which various types of chemical liquid processing and water rinsing are performed, and a drying part 66 which incorporates a spin dryer.

In the substrate processing part 106, behind the chemical liquid processing part 62 and the water rinsing processing part 64, a first substrate dipping mechanism 68 is disposed which includes a lifter head $LH_1$ which can move in the vertical direction and side to side. The lifter head $LH_1$ of the first substrate dipping mechanism 68 dips substrates which are received from the transport robot TR into the chemical liquid bath CB of the chemical liquid processing part 62, or into the water rinsing bath WB of the water rinsing processing part 64. Further, behind the multi-function processing part 63, a second substrate dipping mechanism 69 is disposed which includes a lifter head $LH_2$ which can move in the vertical direction. The lifter head $LH_2$ of the second substrate dipping mechanism 69 holds substrates which are received from the transport robot TR into the multi-function processing bath OB of the multi-function processing part 63.

The substrate transfer/transport mechanism 22 includes the transport robot TR which has the same functions as those of the transport robot TR which is shown in FIG. 2. A pair of rotatable hands 80, 81 which are disposed on the transport robot TR holds substrates, and transfers the substrates which are held by holders 41a, 41b of the substrate removing part 41 to the lifter head $LH_1$ which is disposed to the first substrate dipping mechanism 68 of the substrate processing part 106, or from the lifter head $LH_1$ to the lifter head $LH_2$ of the second substrate dipping mechanism 69, or from the lifter head $LH_2$ to the holders 42a, 42b of the substrate storing part 42.

Figure 12:
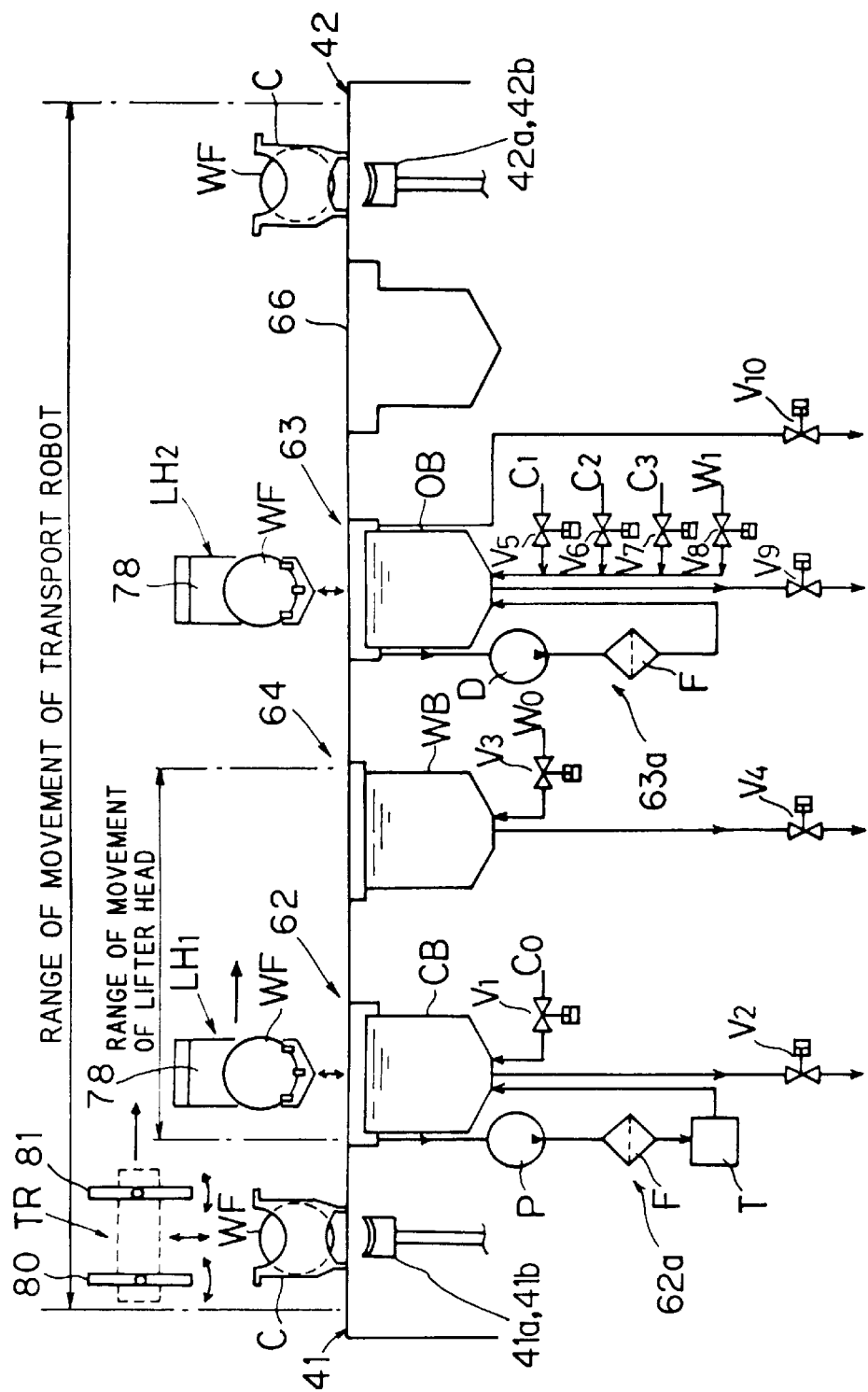
FIG. 12 is a diagram showing the front side structure of the substrate processing apparatus of FIG. 11.

FIG. 12 is a diagram showing the structure of the substrate processing apparatus of FIG. 11 as viewed from the front side. A supply pipe for supplying a chemical liquid $C_0$ is connected through a valve $V_1$ to a bottom side of the chemical liquid bath CB of the chemical liquid processing part 62, and a drain pipe is connected through a valve $V_2$ to the bottom side of the chemical liquid bath CB. Further, the chemical liquid bath CB includes a circulation mechanism 62a. The circulation mechanism 62a includes a pump P for sending the chemical liquid $C_0$ under pressure which flows over from the top of the chemical liquid bath CB, and a filter F for filtering the chemical liquid $C_0$ which is sent under pressure from the pump P. The circulation mechanism 62a further includes a temperature adjuster T which serves as means for adjusting the temperature of the chemical liquid $C_0$ which is filtered by the filter F. The chemical liquid $C_0$ which is maintained at a desired temperature by the temperature adjuster T circulates from the bottom side of the chemical liquid bath CB back into this bath again. In this manner, the circulation mechanism 62a discharges the chemical liquid $C_0$ from the chemical liquid bath CB and returns the discharged chemical liquid $C_0$ back into the chemical liquid bath CB once again, whereby convection of the chemical liquid $C_0$ is created within the chemical liquid bath CB while the temperature adjuster T adjusts the temperature of the chemical liquid $C_0$. Hence, it is possible to maintain the temperature of the chemical liquid $C_0$ within the chemical liquid bath CB uniform and constant. In addition, since the circulation mechanism 62a includes the filter F which filters the chemical liquid $C_0$, the chemical liquid $C_0$ which circulates back into the chemical liquid bath CB is always kept clean. Although the temperature adjuster T is disposed within the circulation mechanism 62a in this embodiment, the temperature adjuster T may be disposed within the chemical liquid bath CB.

The chemical liquid $C_0$ which fills the chemical liquid bath CB is preferably a chemical liquid which is used at a temperature which is higher than 100° C. (high-temperature acid liquid), a chemical liquid which requires fine adjustment of the temperature, or a chemical liquid which is used as it is dense without diluted with deionized water. Such a chemical liquid $C_0$ may be hydrogen perioxide sulfate solution (i.e., solution mixing sulfuric acid and hydrogen perioxide solution) which is obtained by mixing sulfuric acid and hydrogen perioxide solution with a volume ratio of 4:1 to 2:1, not diluted with deionized water and maintained at a high temperature of 130° C. or more, for example. Alternatively, phosphoric acid, nitric acid, sulfuric acid (including those with which ozone is used) are used at a high temperature of 160° C. or more, without diluted with deionized water. Where the chemical liquid $C_0$ requires fine adjustment of the temperature, buffered hydrofluoric acid, for instance, may be used as the chemical liquid $C_0$. Buffered hydrofluoric acid is used at a normal temperature (20° C. to 25° C.), and requires fine adjustment of the temperature with a tolerance of 0.1° C. or smaller.

The chemical liquid bath CB contains one type of chemical liquid $C_0$. The chemical liquid $C_0$ is never replaced with a different type of chemical liquid or deionized water. Hence, the chemical liquid $C_0$ is always adjusted to a constant high temperature. Further, when a high density chemical liquid is used as the chemical liquid $C_0$, since the chemical liquid $C_0$ is never replaced with a different type of chemical liquid or deionized water, the chemical liquid $C_0$ is always maintained at a high density.

A supply pipe for supplying deionized water is connected through a valve $V_3$ to a bottom side of the water rinsing bath WB of the water rinsing processing part 64. A drain pipe is also connected to the bottom side of the water rinsing bath WB through a valve $V_4$.

The multi-function processing bath OB of the multi-function processing part 63 is structured to sequentially contain a chemical liquid which does not always require special temperature adjustment and deionized water, so that it is possible to perform various types of processing successively within the only one multi-function processing bath OB. Through valves $V_5$ to $V_8$, supply pipes for selectively supplying any one of chemical liquids $C_1$ to $C_3$ and deionized water $W_1$ are connected to the bottom side of the multi-function processing bath OB, and a drain pipe is also connected to the bottom side of the multi-function processing bath OB through a valve $V_9$. Further, a drain pipe is also connected to a top side of the multi-function processing bath OB through a valve $V_{10}$, to discharge an overflow of the chemical liquids $C_1$ to $C_3$ and deionized water $W_1$ outside the bath. The multi-function processing bath OB includes a circulation mechanism 63a. The circulation mechanism 63a includes a pump P for sending any one of the chemical liquids $C_1$ to $C_3$ under pressure which flows over from the top of the multi-function processing bath OB, and a filter F for filtering the chemical liquid which is sent under pressure from the pump P. The chemical liquids $C_1$ to $C_3$ circulate from the bottom side of the multi-function processing bath OB back into this bath again. Although not shown in FIG. 12, on the bottom portion of the multi-function processing bath OB, a mechanism is disposed which uniformly spreads any one of the chemical liquids $C_1$ to $C_3$ which flows back from the circulation mechanism 63a and creates uniform convection of the chemical liquids $C_1$ to $C_3$ within the bath. Since uniform convection of the chemical liquids $C_1$ to $C_3$ is created in this manner, it is possible to maintain the quality of the chemical liquids $C_1$ to $C_3$ within the multi-function processing bath OB always constant.

The chemical liquids $C_1$ to $C_3$ to be contained within the multi-function processing bath OB are preferably a chemical liquid which does not have to be maintained at a temperature which is higher than 100° C., which does not require fine temperature adjustment, and which does not have to be maintained at a high density. Such a chemical liquid may be hydrochloric acid hydrogen peroxide solution, i.e., diluted solution mixing hydrochloric acid, hydrogen peroxide solution and deionized water with a volume ratio of 1:1:6 to 1:2:15, for instance, and is used at a temperature from 40° C. to 85° C. Alternatively, the chemical liquids $C_1$ to $C_3$ may be hydrogen peroxide ammonia solution, i.e., mixture of ammonia solution and hydrogen peroxide solution, which is obtained by mixing ammonia solution, hydrogen peroxide solution and deionized water with a volume ratio of 1:1:5 to 1:2:7, and is used at a temperature from 40° C. to 85° C. Further alternatively, the chemical liquids $C_1$ to $C_3$ may be hydrofluoric acid which is diluted with deionized water with a volume ratio of hydrofluoric acid:deionized water=1:20 to 1:1000, and is used at a normal temperature.

Now, an operation of the substrate processing apparatus according to the sixth preferred embodiment will be briefly described with reference to FIG. 12. Substrates WF within the carrier C are taken out by the pair of holders 41a, 41b which moves upward, and held by and handed over to the pair of hands 80, 81 of the transport robot TR. The substrates WF which are held by the pair of hands 80, 81 are transported in the horizontal direction and received by the substrate holding member 78 of the lifter head $LH_1$. The substrates WF which are held by the substrate holding member 78 are dipped into the chemical liquid bath CB of the chemical liquid processing part 62 and processed with a chemical liquid in the bath. The substrates WF are dipped into the water rinsing bath WB of the water rinsing processing part 64 to be rinsed with water. Following this, the water-rinsed substrates WF are handed over to the pair of hands 80, 81 of the transport robot TR from the substrate holding member 78 of the lifter head $LH_1$, and further from the pair of hands 80, 81 to the substrate holding member 78 of the lifter head $LH_2$. Next, the substrates WF which are held by the substrate holding member 78 are dipped into the multi-function processing bath OB, repeatedly processed with chemical liquids and rinsed with deionized water in the bath, and rinsed with deionized water for the last time. The water-rinsed substrates WF are then handed over from the substrate holding member 78 of the lifter head $LH_2$ to the pair of hands 80, 81 of the transport robot TR. The substrates WF which are held by the pair of hands 80, 81 are then transferred to the drying part 66 to be dried thereat. Lastly, the dried substrates WF are handed over to the pair of hands 80, 81 of the transport robot TR, and further to the pair of holders 42a, 42b, and housed into the carrier C.

More specifically describing the operation at the multi-function processing part 63, with the multi-function processing bath OB filled with the chemical liquid $C_1$, for instance, substrates WF which are held by the substrate holding member 78 are dipped into the bath OB and left as such for a predetermined period of time to complete processing with the chemical liquid $C_1$. In this condition, while the chemical liquid $C_1$ is kept flowing over with supply of deionized water $W_1$ from below, the chemical liquid $C_1$ within the bath is replaced with deionized water $W_1$, so that the substrates WF are rinsed with water. Next, the chemical liquid $C_2$ is supplied from below so that deionized water $W_1$ flows over, whereby deionized water $W_1$ within the bath is replaced with the chemical liquid $C_2$. Processing with the chemical liquid $C_2$ of the substrates WF which are held within the bath is started in this manner, and the substrates WF are left as such for a predetermined period of time to complete processing with the chemical liquid $C_2$. In this condition, supply of deionized water $W_1$ from below is resumed so that the chemical liquid $C_2$ flows over. While the chemical liquid $C_2$ flows over the chemical liquid $C_2$ within the bath is replaced with deionized water $W_1$, so that rinsing of the substrates WF with water completes. By repeating such an operation, it is possible to successively process substrates WF by combination of processing with desired chemical liquids. Since the substrates WF are not exposed to atmosphere during processing, it is possible to prevent inconvenience such as creation of unwanted films on surfaces of the substrates WF due to atmosphere. In addition, since the substrates WF are not transported between the baths, contamination and adhesion of particles are easily suppressed.

Although the processing as described above requires to exchange chemical liquids and deionized water while letting the chemical liquids and deionized water flow over, it is possible to introduce a chemical liquid or deionized water which is to be used next after draining a chemical liquid or deionized water which is currently used. In such a case, although substrates WF are exposed to atmosphere, since the substrates WF are not transported between baths, it is relatively easy to suppress contamination and adhesion of particles. Further, since only one bath realizes multiple functions, it is possible to reduce the size of the structure for cleaning substrates.

A specific operation of the lifter head $LH_1$ of the first substrate dipping mechanism 68 is similar to that shown in FIGS. 6A to 6F. On the other hand, the lifter head $LH_3$ of the second substrate dipping mechanism 69 moves in the vertical direction between the waiting position above the multi-function processing bath OB and the dipping position within the multi-function processing bath OB.

<Seventh Preferred Embodiment>

Figure 13:
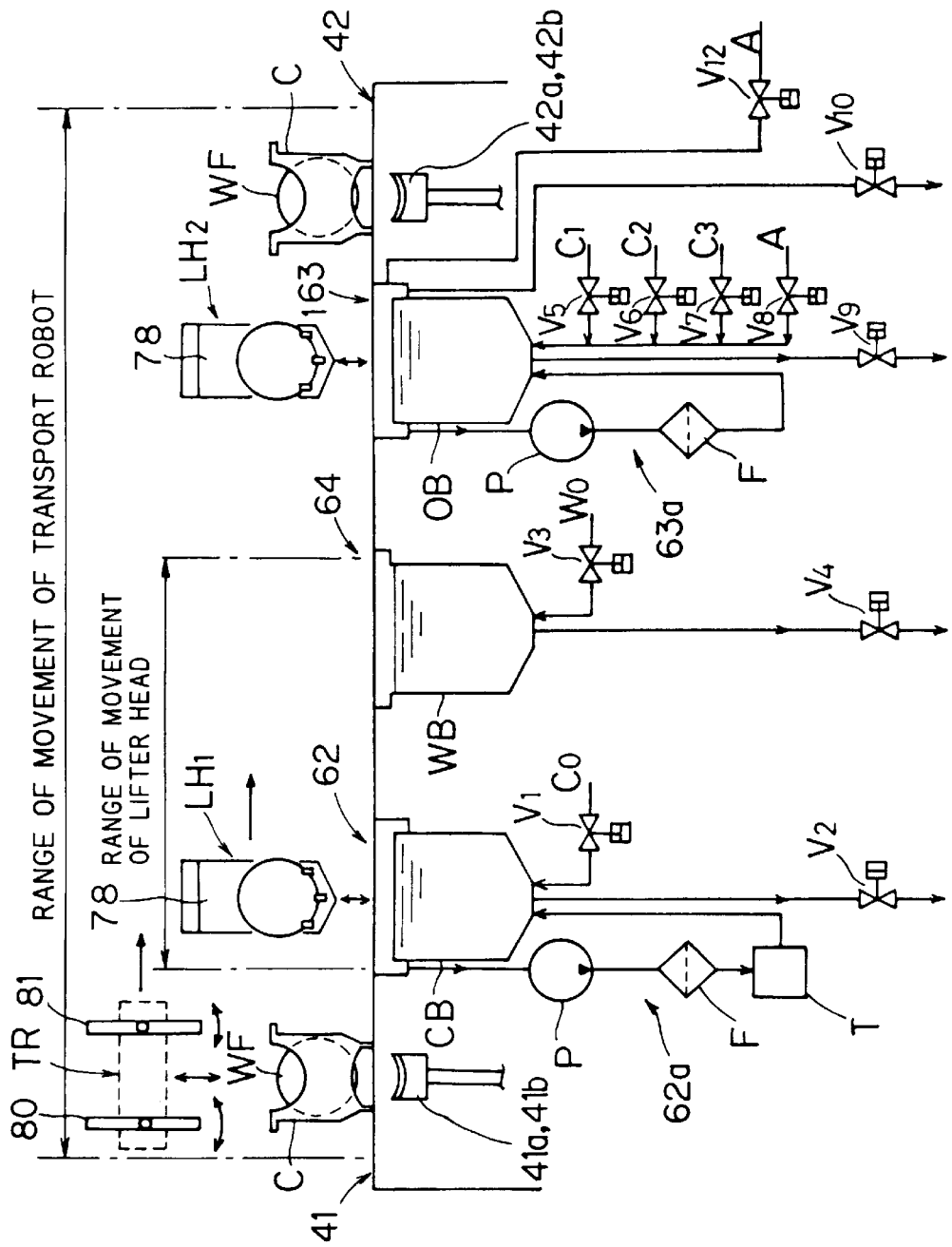
FIG. 13 is a diagram showing a front side structure of a substrate processing apparatus according to a seventh preferred embodiment.

FIG. 13 is a diagram showing a front side structure of a substrate processing apparatus according to a seventh preferred embodiment. Since the seventh preferred embodiment is modification of the sixth preferred embodiment, and therefore, similar reference symbols will be assigned to portions which are common to the sixth preferred embodiment and a redundant description will be simply omitted.

As clearly shown in FIG. 13, the substrate processing apparatus according to the seventh preferred embodiment does not comprise the drying part 66 which incorporates a spin dryer. Instead, a multi-function processing part 163 which includes the multi-function processing bath OB also performs drying under reduced pressure. In short, the multi-function processing bath OB is located within a chamber not shown which reduces the internal pressure. After final rinsing with deionized water $W_1$, steamed alcohol A is supplied onto the surface of deionized water $W_1$ within the multi-function processing bath OB so that moisture on surfaces of substrates WF is replaced with alcohol when the substrates WF are lifted upward. This is followed by reduction of the pressure inside the chamber, whereby the substrates WF are dried quickly and uniformly. In this manner, since it is possible not only to perform processing with a chemical liquid and processing with deionized water only within the multi-function processing bath OB but also to perform drying only within the multi-function processing bath OB, substrates WF are dried without taking out the substrates WF from the bath, which in turn prevents disadvantages such as a water mark and contamination due to atmosphere.

While the foregoing has described the present invention in relation to the sixth and the seventh preferred embodiments, the present invention is not limited to the sixth and the seventh preferred embodiments. For example, although the chemical liquid processing part 62 includes only one chemical liquid bath CB in these preferred embodiments, the chemical liquid processing part 62 may include two or more same type or different types of chemical liquid baths so as to increase the level of diversification of processing on substrates. Further, although the water rinsing processing part 64 includes only one water rinsing bath WB in these preferred embodiments, the water rinsing processing part 64 may include two or more water rinsing baths.

In addition, although the chemical liquid processing part 62 and the water rinsing processing part 64 function as only one processing unit in these preferred embodiments, to increase the level of diversification of processing on substrates, the preferred embodiments may use a plurality of such processing units each consisting of one chemical liquid bath CB and one water rinsing bath WB or of three or more of these baths. In such a case, within each processing unit, substrates WF are transported by a substrate dipping mechanism which includes a lifter head which can travel to the side as the lifter head $LH_1$ of FIG. 12. While each chemical liquid bath and each water rinsing bath may include a lifter head which can move only in the vertical direction as the lifter head $LH_2$ of FIG. 12 instead of the lifter head $LH_1$ which can travel to the side, when a lifter head which can move only in the vertical direction is used, it is necessary to dispose mechanisms for cleaning and drying only the hands 80, 81 of the transport robot TR within the apparatus.

Further, although the multi-function processing part 63 includes only one multi-function processing bath OB in these preferred embodiments above, the multi-function processing part 63 may include a plurality of multi-function processing baths OB so as to increase the level of diversification of processing on substrates. Further, the multi-function processing bath OB is not limited to the particular combination of functions described earlier in these preferred embodiments above. Rather, the multi-function processing bath OB may have two functions of processing with only one chemical liquid and rinsing with water, or two functions of rinsing with water and drying, or three or more functions, depending on the need. When the multi-function processing bath OB is modified as such, the multi-function processing bath OB may internally include a temperature adjuster which can adjust the temperature of a processing liquid with the bath to a certain extent.

In these preferred embodiments above, the water rinsing processing part 64 is disposed between the chemical liquid processing part 62 and the multi-function processing part 63.

Hence, when it is impossible to transport substrates WF to the multi-function processing part 63 due to an accident within the multi-function processing part 63 or the like upon processing with a chemical liquid at the chemical liquid processing part 62, since the substrates WF which were already processed with the chemical liquid can be loaded into the multi-function processing part 63, it is possible to prevent the substrates WF from getting excessively processed at the chemical liquid processing part 62. This realizes excellent cleaning.

While not clearly described in these preferred embodiments above, it is of course possible to utilize the substrate processing apparatuses according to these preferred embodiments when substrates are to be loaded successively. For instance, in the sixth preferred embodiment, a group of substrates WF from the carrier C are put into the processing unit which consists of the chemical liquid processing part 62 and the water rinsing processing part 64. Next, after loading the group of substrates WF which were processed at this processing unit into the multi-function processing part 63, another group of substrates WF from the carrier C are put into the processing unit which consists of the chemical liquid processing part 62 and the water rinsing processing part 64. Following this, after loading the group of substrates WF which were processed at the multi-function processing part 63 into the drying part 66, the group of substrates WF from the processing unit which consists of the chemical liquid processing part 62 and the water rinsing processing part 64 are loaded into the multi-function processing part 63, and still another group of substrates WF from the carrier C are loaded into this processing unit. By repeating such an operation, substrates are processed successively and a throughput of the processing on substrates increases.

<Eighth Preferred Embodiment>

Figure 14:
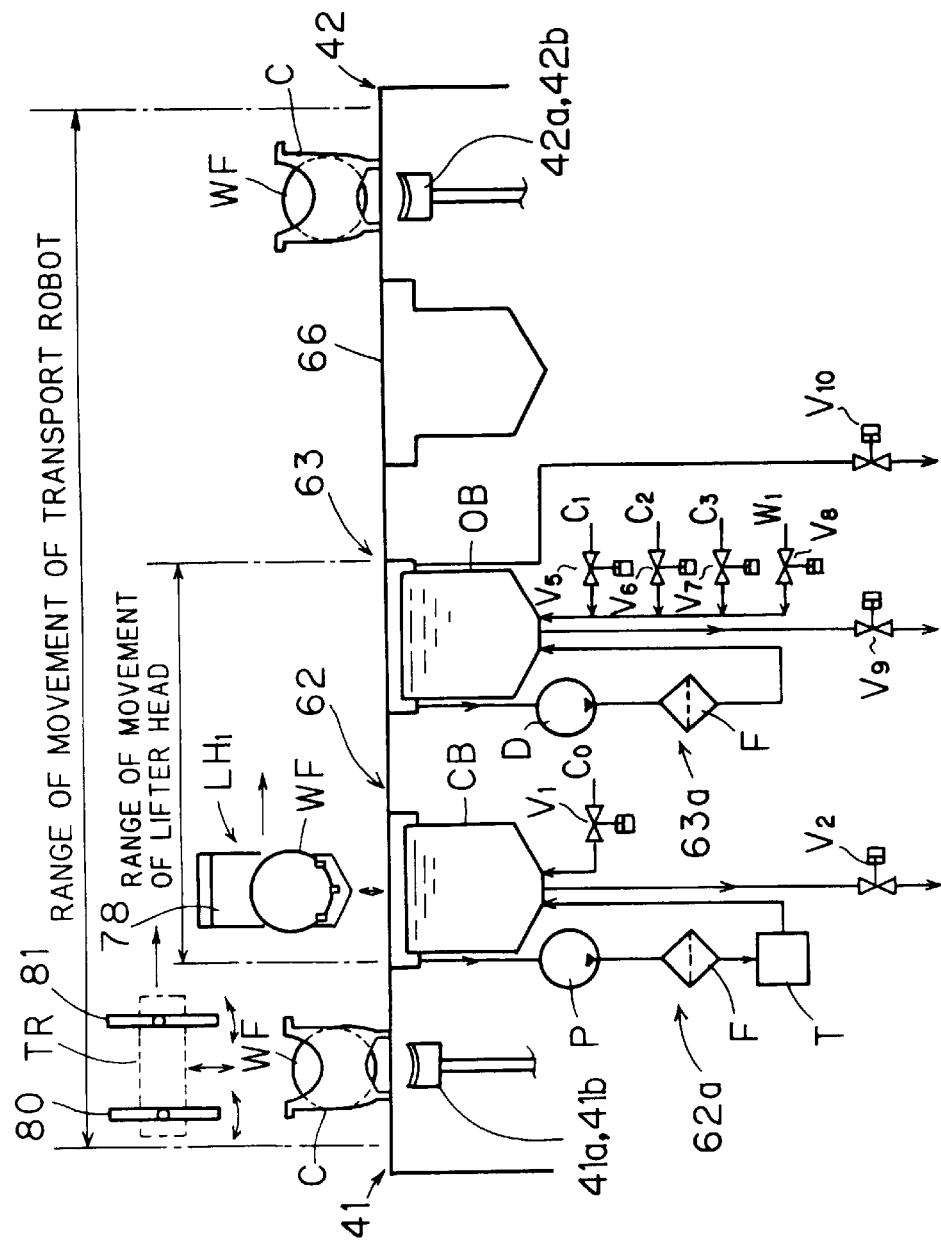
FIG. 14 is a diagram showing a front side structure of a substrate processing apparatus according to an eighth preferred embodiment.

FIG. 14 is a diagram showing a front side structure of a substrate processing apparatus according to an eighth preferred embodiment. The eighth preferred embodiment is modification of the sixth preferred embodiment.

As clearly shown in FIG. 14, the substrate processing apparatus according to the eighth preferred embodiment does not comprise the water rinsing processing part. Hence, substrates which are processed in the chemical liquid bath CB which is disposed in the chemical liquid processing part 62 are rinsed with water within the multi-function processing bath OB of the multi-function processing part 63. Behind the chemical liquid processing part 62 and the multi-function processing part 63, a substrate dipping mechanism is disposed which includes the lifter head $LH_1$ which can move in the vertical direction and to the side. The lifter head $LH_1$ dips substrates WF which are received from the transport robot TR into the chemical liquid bath CB of the chemical liquid processing part 62 or into the multi-function processing bath OB of the multi-function processing part 63.

<Ninth Preferred Embodiment>

Figure 15:
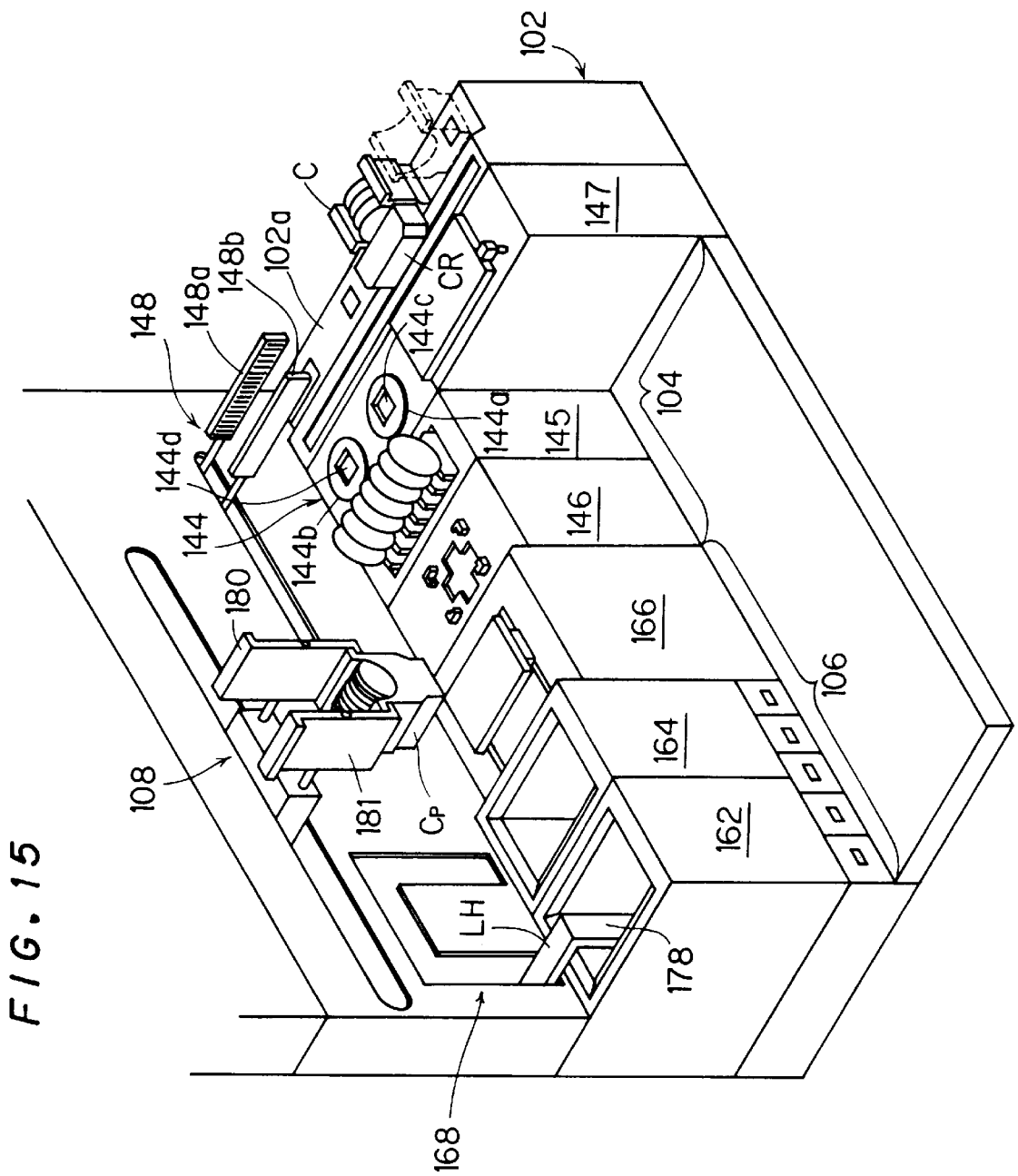
FIG. 15 is a perspective view showing an overall structure of a substrate processing apparatus according to a ninth preferred embodiment.
Figure 16:
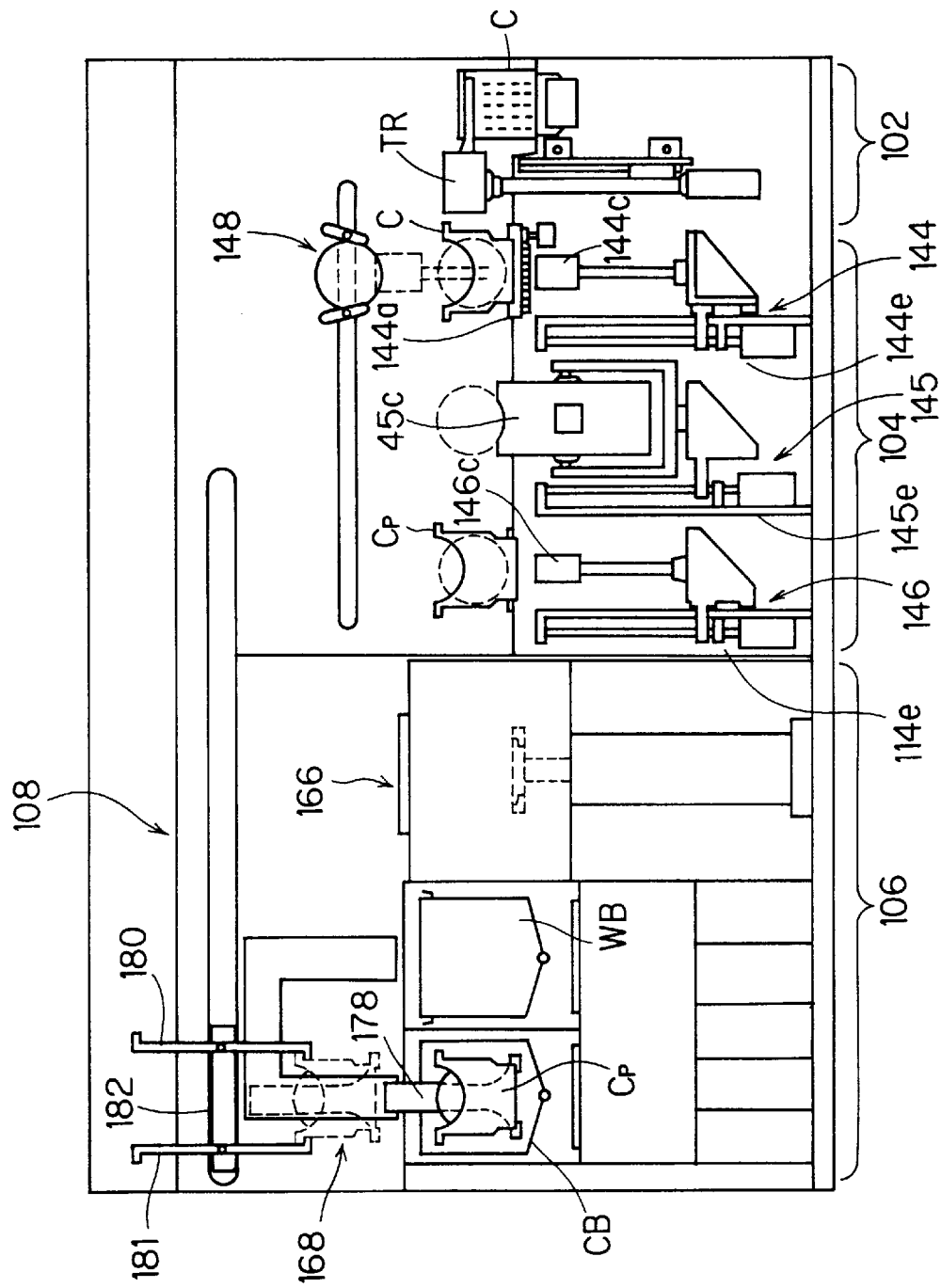
FIG. 16 is a diagram for describing a front side structure of the apparatus of FIG. 15.

FIG. 15 is a perspective view showing a structure of a substrate processing apparatus according to a ninth preferred embodiment, and FIG. 16 is a front view showing the structure of the substrate processing apparatus according to the ninth preferred embodiment. This apparatus is formed by a carrier loading/unloading part 102, a substrate transfer part 104, a substrate processing part 106, and a carrier transport mechanism 108. The carrier loading/unloading part 102 receives transport carriers C which house unprocessed substrates and discharges transport carriers which house processed substrates. After substrates within the pair of transport carriers C which was loaded at the carrier loading/unloading part 102 are taken out of the carriers, a pitch of the substrates is changed within the substrate transfer part 104 and the substrates are housed into a processing carrier $C_p$. In the substrate processing part 106, unprocessed substrates within the processing carrier $C_p$ are sequentially cleaned. In a back part of the apparatus, the carrier transport mechanism 108 is disposed across the substrate transfer part 104 and the substrate processing part 106, so as to transport and transfer yet-to-be-cleaned substrates, substrate under cleaning and cleaned substrates from one part to another, by the processing carrier $C_p$.

The carrier loading/unloading part 102 includes a carrier transfer robot CR which can move in the horizontal and the vertical directions and rotate about a vertical axis, so as to transfer a pair of transport carriers C which is mounted at a predetermined position on a carrier stage 102a onto the substrate taking part 104.

The substrate taking part 104 includes a first substrate handing part 144, a pitch changing part 145, a second substrate handing part 146, and a substrate transport mechanism 148. The first substrate handing part 144 receives a pair of transport carriers C which is loaded at a carrier loading/unloading part 121 and takes out a plurality of substrates from the transport carriers C. The pitch changing part 145 changes a pitch of the substrates which are taken out of the transport carriers C. The second substrate handing part 146 receives the substrates having a smaller pitch and houses the substrates into a processing carrier $C_p$.

The first substrate handing part 144 includes a pair of rotatable tables 144a, 144b and a pair of holders 144d, 144e. The rotatable tables 144a and 144b both rotate the directions of the pair of transport carriers C which is transferred from carrier loading/unloading part 102 with the carrier transfer robot CR by 90 degrees. The holders 144d and 144e are moved in the vertical direction by an actuator 144e. Guide grooves are formed in top surfaces of the holders 144d and 144e so as to hold unprocessed substrates which are housed in the both transport carriers C upright. Hence, when the holders 144d and 144e are moved upward, the substrates are pushed up from and taken out of the transport carriers C. The substrates which are taken out of the transport carriers C are held by and handed over to a pair of hands 148a, 148b of the substrate transport mechanism 148. Plurality of grooves are formed at the surface of each pair of hands 148a, 148b. A pitch of plurality of grooves is a half one of the substrates in the transport carriers C. After transported in the horizontal direction, the substrates are loaded into the substrate pitch changing part 145.

In the pitch changing part 145, a compression part 145c compresses the pitch of the substrates which are taken out of the transport carriers C to about half. The compression part 145c is moved in the vertical direction by an actuator 145e. Hence, when the compression part 145c is moved upward, the substrates having a compressed half pitch are once again held by and handed over to the pair of hands 148a, 148b of the substrate transport mechanism 148. After transported in the horizontal direction, the substrates are loaded into the second substrate handing part 146.

The second substrate handing part 146 includes a holder 146c which moves in the vertical direction by an actuator 146c. The holder 146c receives the substrates which are held by the pair of hands 148a, 148b and houses the substrates into the processing carrier $C_p$. The holder 146c is also rotatable about a vertical axis. Since a lower end of the processing carrier $C_p$ is pushed upward by the holder 146c if the holder 146c is moved upward after rotated by 90 degrees, the processing carrier $C_p$ can be moved upward and handed over to a pair of hands 180, 181 of the carrier transport mechanism 108.

A carrier cleaning part 147 receives a pair of transport carriers C from which unprocessed substrates are discharged at the first substrate handing part 144, from the carrier transfer robot CR. The carrier cleaning part 147 then cleans the transport carriers C. And the cleaned transport carriers C are transferred to the first substrate handing part 144, where the cleaned transport carriers C receive cleaned substrates.

The substrates which are put into the processing carrier $C_p$ at the second substrate handing part 146 are held by and handed over to the pair of hands 180, 181 of the carrier transport mechanism 108. After transported in the horizontal direction, the substrates are loaded into the substrate processing part 106.

The substrate processing part 106 includes a chemical liquid processing part 162 which has the chemical liquid bath CB which is filled with sulfuric acid, ammonia, hydrochloric acid, hydrofluoric acid or the like, a water rinsing processing part 164 which has the water rinsing bath WB which is filled with deionized water, and a drying part 166 for drying substrates under IPA (isopropyl alcohol) vapor with heat.

In the substrate processing part 106, a substrate dipping mechanism 168 is disposed behind the chemical liquid processing part 162 and the water rinsing processing part 164. A lifter head LH which is disposed to the substrate dipping mechanism 168 receives substrates from the hands 180 and 181 and dips the substrates into the chemical liquid bath CB of the chemical liquid processing part 162 or into the water rinsing bath WB of the water rinsing processing part 164. The lifter head LH includes a carrier holding member 178 of a chemical-resistant material which holds the lower end of the processing carrier $C_p$ which houses substrates and is dipped into the chemical liquid bath CB and the water rinsing bath WB together with the processing carrier $C_p$.

The processing carrier $C_p$ for housing processed substrates which are processed at the substrate processing part 106 is transferred into the second substrate handing part 146 by the carrier transport mechanism 108. The processed substrates which are taken out of the processing carrier $C_p$ are transferred into the pitch changing part 145 by the substrate transport mechanism 148, and the pitch of the substrates is changed to the original pitch. The substrate now having the pitch which is changed to the original state at the pitch changing part 145 are transferred into the first substrate handing part 144 by the substrate transport mechanism 148, and housed into the transport carriers C which are cleaned. The transport carriers C which are loaded into the first substrate handing part 144 is transferred with the carrier transfer robot CR into the carrier loading/unloading part 102. This completes the processing.

Figure 17A:
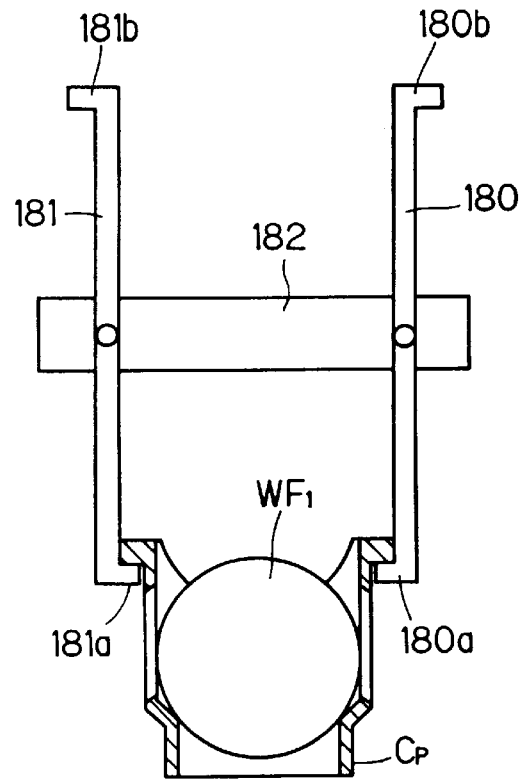
FIGS. 17A and 17B are diagrams for describing a structure and an operation of a hand of a transport robot of a substrate hold/transfer part.
Figure 17B:
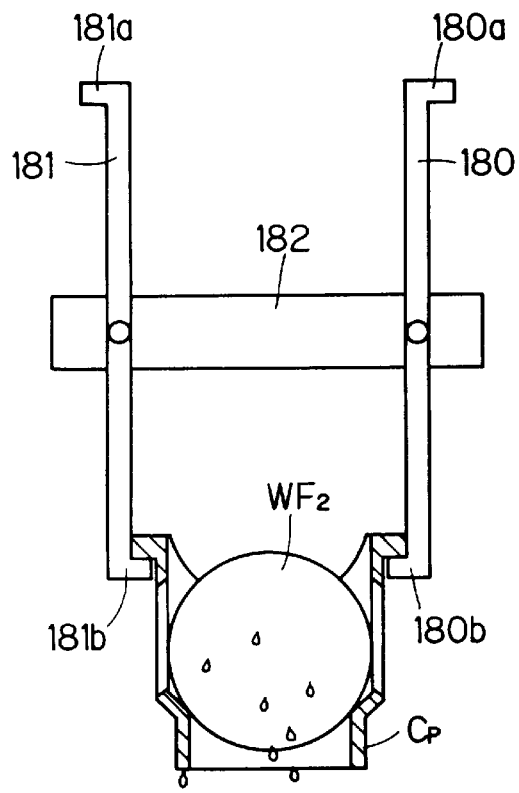

FIGS. 17A and 17B are diagrams for describing a structure and an operation into details of the pair of hands 180, 181 of a transport head 182 which moves to the left and the right to the carrier transport mechanism 108. FIG. 17A shows a pair of hooks 180a, 181a, i.e., a first handling part, as it holds the processing carrier Cp which houses dried substrates $WF_1$, while FIG. 17B shows a pair of hooks 180b, 181b, i.e., a second handling part, as it holds the processing carrier $C_p$ which houses a plurality of substrates $WF_2$ to which deionized water adheres. In the case of the dry processing carrier $C_p$ as shown in FIG. 17A, the hooks 180a and 181a which are disposed to face one ends of the hands 180 and 181, respectively, hang the dry processing carrier $C_p$ which houses the dried substrates $WF_1$ which are received from the second substrate handing part 146 or the drying part 166. On the other hand, in the case of the processing carrier $C_p$ which carries deionized water as shown in FIG. 17B, the hands 180 and 181 are respectively rotated 180 degrees at different times from the states shown in FIG. 17A, and the hooks 180b and 181b which are faced with each other hang the processing carrier $C_p$ which carries deionized water which is originated from the water rinsing processing part 164 side. In this manner, the hooks 180a and 181a which serve as the first handling part hold only the dry processing carrier $C_p$ which is not yet processed, while the hooks 180b and 181b which serve as the second handling part hold only the processing carrier $C_p$ which carries deionized water after processed. Since the handling parts are selectively used, it is not always necessary to dry the pair of hands 180, 181.

Figure 18:
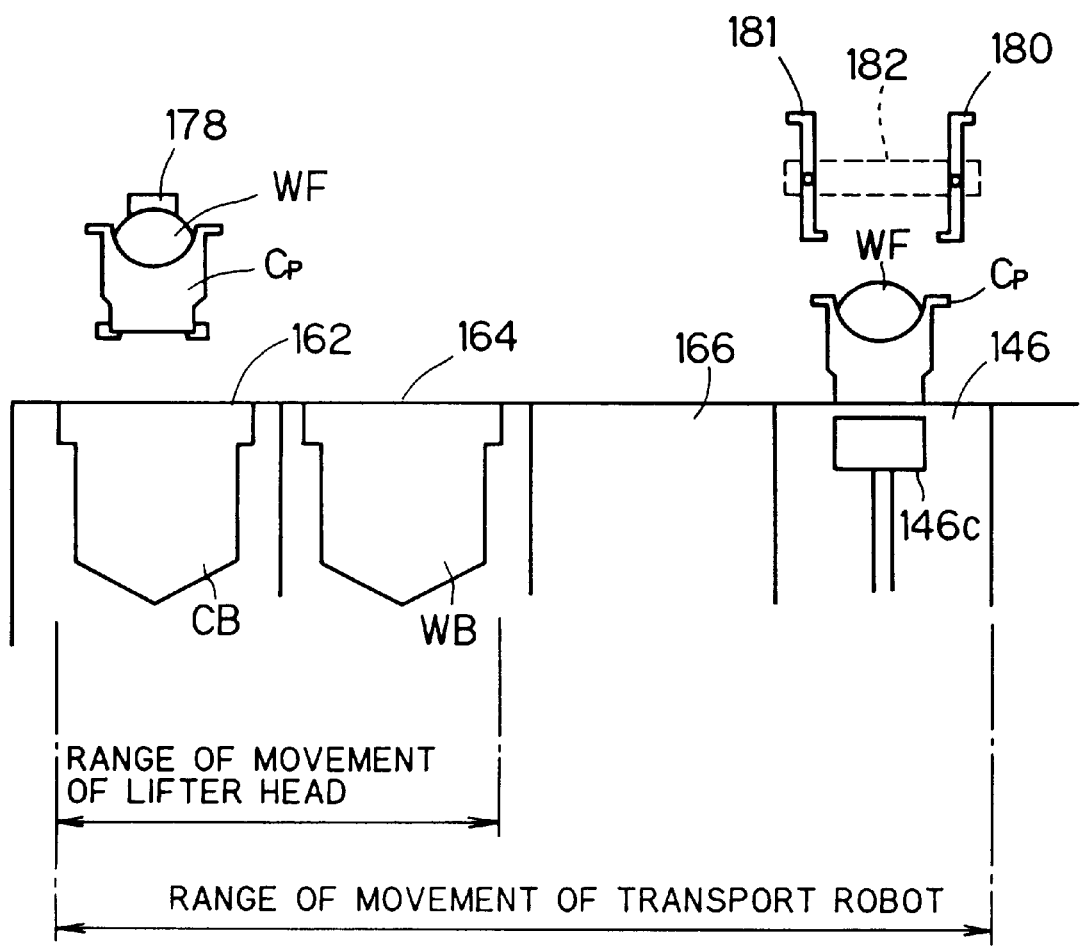
FIG. 18 is a diagram showing a front side structure of the substrate processing apparatus of FIG. 15.
Figure 19A:
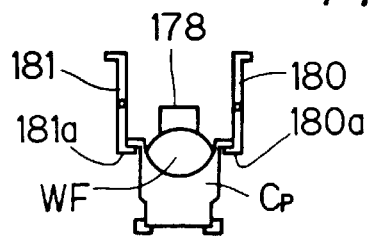
FIGS. 19A to 19F are diagrams for describing an operation of the substrate processing apparatus of FIG. 15.
Figure 19D:
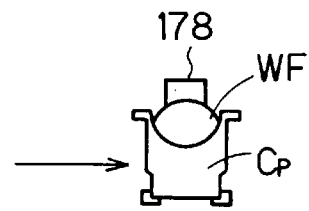
Figure 19B:
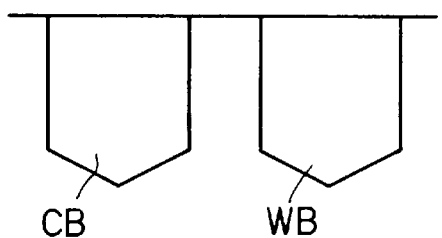
Figure 19E:
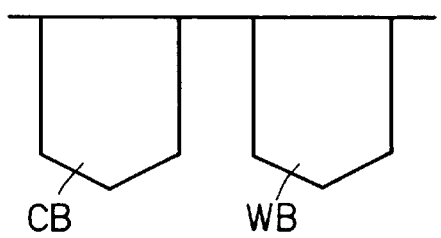
Figure 19C:
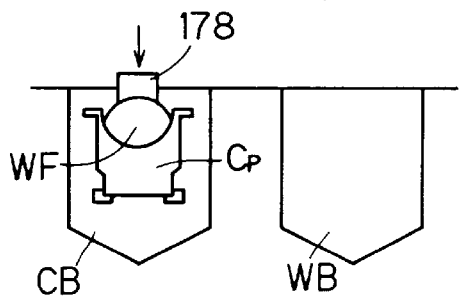
Figure 19F:
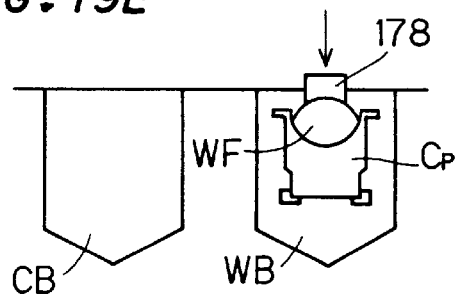

FIG. 18 diagrammatically shows the front side structure of the substrate processing apparatus of FIG. 15. Now, an operation of the substrate processing apparatus of FIG. 15 will be described with reference to FIG. 18. The processing carrier $C_p$ which is mounted on the second substrate handing part 146 is pushed upward by the holder 146a, and held by and handed over to the pair of hands 180, 181 of the carrier transport mechanism 108. After transported in the horizontal direction, the processing carrier $C_p$ which is held by the pair of hands 180, 181 is handed over to the carrier holding member 178. The processing carrier $C_p$ which is held by the carrier holding member 178 is dipped into the chemical liquid bath CB of the chemical liquid processing part 162 to be processed with a chemical liquid. The processing carrier $C_p$ is then dipped into the water rinsing bath WB of the water rinsing processing part 164 to be rinsed with water. Next, the processing carrier $C_p$ housing the water-rinsed substrates WF is handed over to the pair of hands 180, 181 of the carrier transport mechanism 108 from the carrier holding member 178. The processing carrier $C_p$ is thereafter transferred into the drying part 166 to be dried. Lastly, after handed over to the pair of hands 180, 181 of the carrier transport mechanism 108, the processing carrier $C_p$ housing the dried substrates WF is transferred into the second substrate handing part 146 through cooperation with the holder 146c.

Chemical liquid processing and water rinsing processing may be repeatedly performed. That is, the carrier holding member 178 may reciprocally circulate so that the operation of dipping the processing carrier $C_p$ housing substrates $W_F$ into the water rinsing bath WB after dipping the same into the chemical liquid bath CB is repeated, to thereby increase the effect of cleaning. During such a repeated operation, a chemical liquid within the chemical liquid bath CB may be replaced with other type of chemical liquid. This enables to perform various treatments on substrates WF.

FIGS. 19A to 19F are diagrams for describing an operation of the carrier holding member 178 into further details. The processing carrier $C_p$ which is held by the hooks 180a and 181a which are disposed on the drying side of the hands 180 and 181 is moved to a first retrieval position above the chemical liquid bath CB (See FIG. 19A). The carrier holding member 178 as it holds the processing carrier $C_p$ moves downward to a first dipping position within the chemical liquid bath CB from the first waiting position (See FIG. 19B). The carrier holding member 178 as it holds the processing carrier $C_p$ which houses substrates WF which were already processed with a chemical liquid moves upward to a first retrieval position above the chemical liquid bath CB from the first dipping position (See FIG. 19C). The carrier holding member 178 as it holds the processing carrier $C_p$ which houses substrates WF which were already processed with a chemical liquid moves to the side to a second retrieval position above the water rinsing bath WB from the first retrieval position above the chemical liquid bath CB (See FIG. 19D). The carrier holding member 178 as it holds the processing carrier $C_p$ which houses substrates WF which were already processed with a chemical liquid moves downward to a second dipping position within the water rinsing bath WB from the second retrieval position (See FIG. 19E). The carrier holding member 178 as it holds the processing carrier $C_p$ which houses substrates WF which were already processed with a chemical liquid moves upward to the second retrieval position above the water rinsing bath WB from the second dipping position, and the carrier holding member 178 housing the water-processed substrates WF is transferred to the hooks 180b and 181b which are disposed on the water-adhering side of the hands 180 and 181 (See FIG. 19F). During such an operation, not only the carrier holding member 178 can receive the processing carrier $C_p$ held by the pair of hands 180, 181 as it is always already rinsed with water, but also the pair of hands 180, 181 can receive the processing carrier $C_p$ as it is always already rinsed with water. This eliminates the necessity of cleaning the pair of hands 180, 181 every time substrates WF are processed.

<Tenth Preferred Embodiment>

Figure 20:
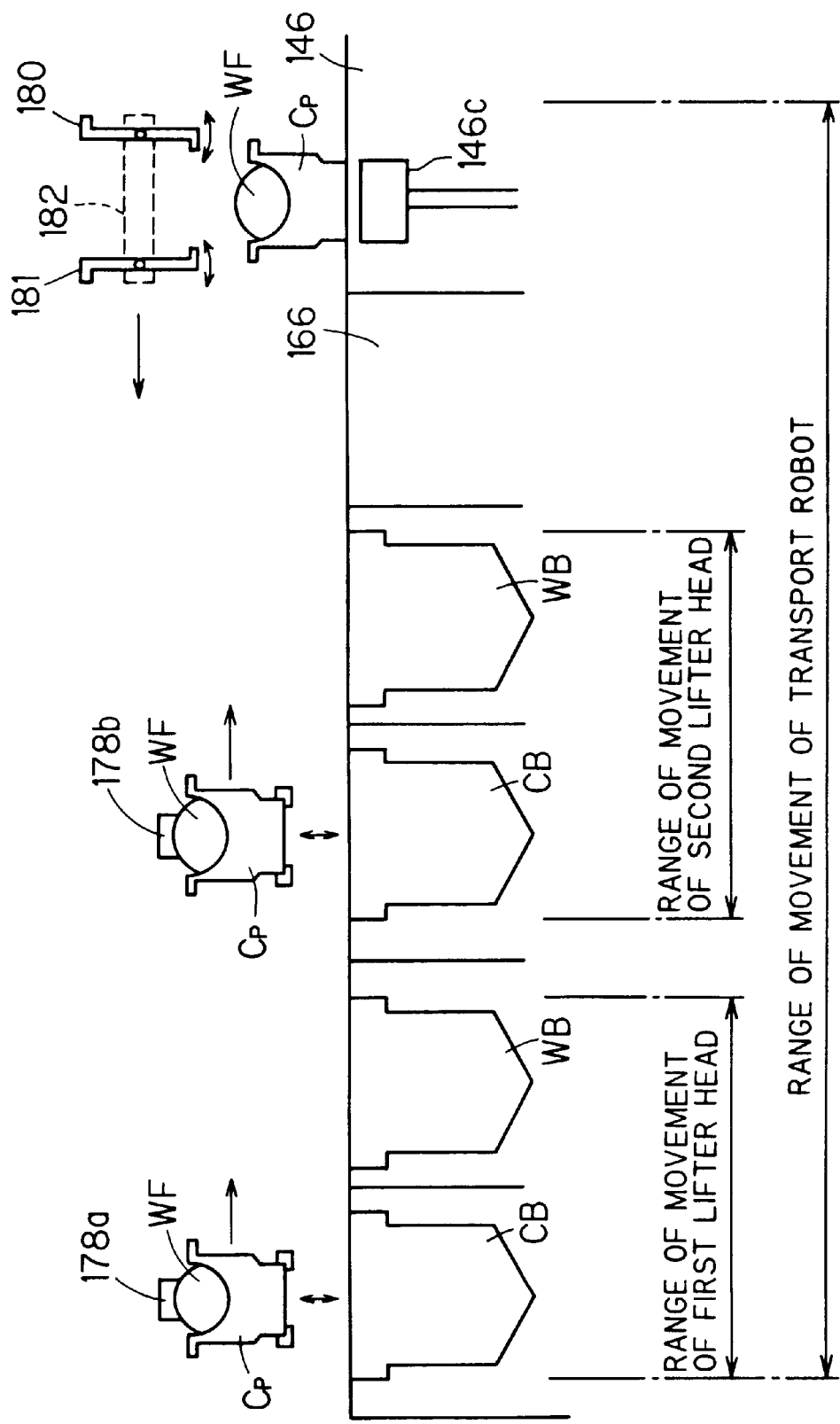
FIG. 20 is a diagram showing a front side structure of a substrate processing apparatus according to a tenth preferred embodiment.

FIG. 20 is a diagram showing a front side structure of a substrate processing apparatus according to a tenth preferred embodiment. Since the tenth preferred embodiment is modification of the ninth preferred embodiment, and therefore, similar reference symbols will be assigned to portions which are common to the ninth preferred embodiment and a redundant description will be simply omitted.

As shown in FIG. 20, the substrate processing apparatus according to the tenth preferred embodiment comprises two processing units where each processing unit consists of adjacent chemical liquid bath CB and one water rinsing bath WB. A first substrate dipping mechanism which includes a first carrier holding member 178a is disposed to one of the processing units. A second substrate dipping mechanism which includes the second carrier holding member 178b is disposed to the other one of the processing units.

Now, an operation will be briefly described. The processing carrier $C_p$ housing unprocessed substrates WF is pushed upward by the holder 146c, and held by and handed over to the pair of hands 180, 181. The processing carrier $C_p$ which is held by the pair of hands 180, 181 is transported in the horizontal direction and handed over to the first carrier holding member 178a. The processing carrier $C_p$ which is held by the first carrier holding member 178a is dipped into the chemical liquid bath CB so that the substrates WF within the processing carrier $C_p$ are processed with a chemical liquid. The processing carrier $C_p$ is dipped into the adjacent water rinsing bath WB so that the substrates WF are rinsed with water. This completes the processing at the front processing unit. Next, after handed over to the pair of hands 180, 181 from the carrier holding member 178, the processing carrier $C_p$ housing the water-rinsed substrates WF is handed over to a second carrier holding member 178b. The processing carrier $C_p$ which is held by the second carrier holding member 178b is dipped into the chemical liquid bath CB so that the substrates WF within the processing carrier $C_p$ are processed with a chemical liquid. The processing carrier $C_p$ is dipped into the adjacent water rinsing bath WB so that the substrates WF are rinsed with water. This completes the processing at the rear processing unit. Next, the processing carrier $C_p$ housing the water-rinsed substrates WF is handed over to the pair of hands 180, 181 from the second carrier holding member 178b. Next, the processing carrier $C_p$ which is held by the pair of hands 180, 181 is transferred into the drying part 166 so that the substrates WF are dried. The processing carrier $C_p$ housing the dried substrates WF is handed over to the pair of hands 180, 181, and through cooperation with the holder 146c, the processing carrier $C_p$ is transferred into the second substrate handing part 146.

As clearly understood from the above, the pair of hands 180, 181 of the substrate processing apparatus according to the tenth preferred embodiment can always receive the processing carrier $C_p$ as it houses water-rinsed substrates WF from the carrier holding members 178a and 178b. Hence, it is not necessary to clean the pair of hands 180, 181 every time substrates WF are processed.

<Eleventh Preferred Embodiment>

Figure 21:
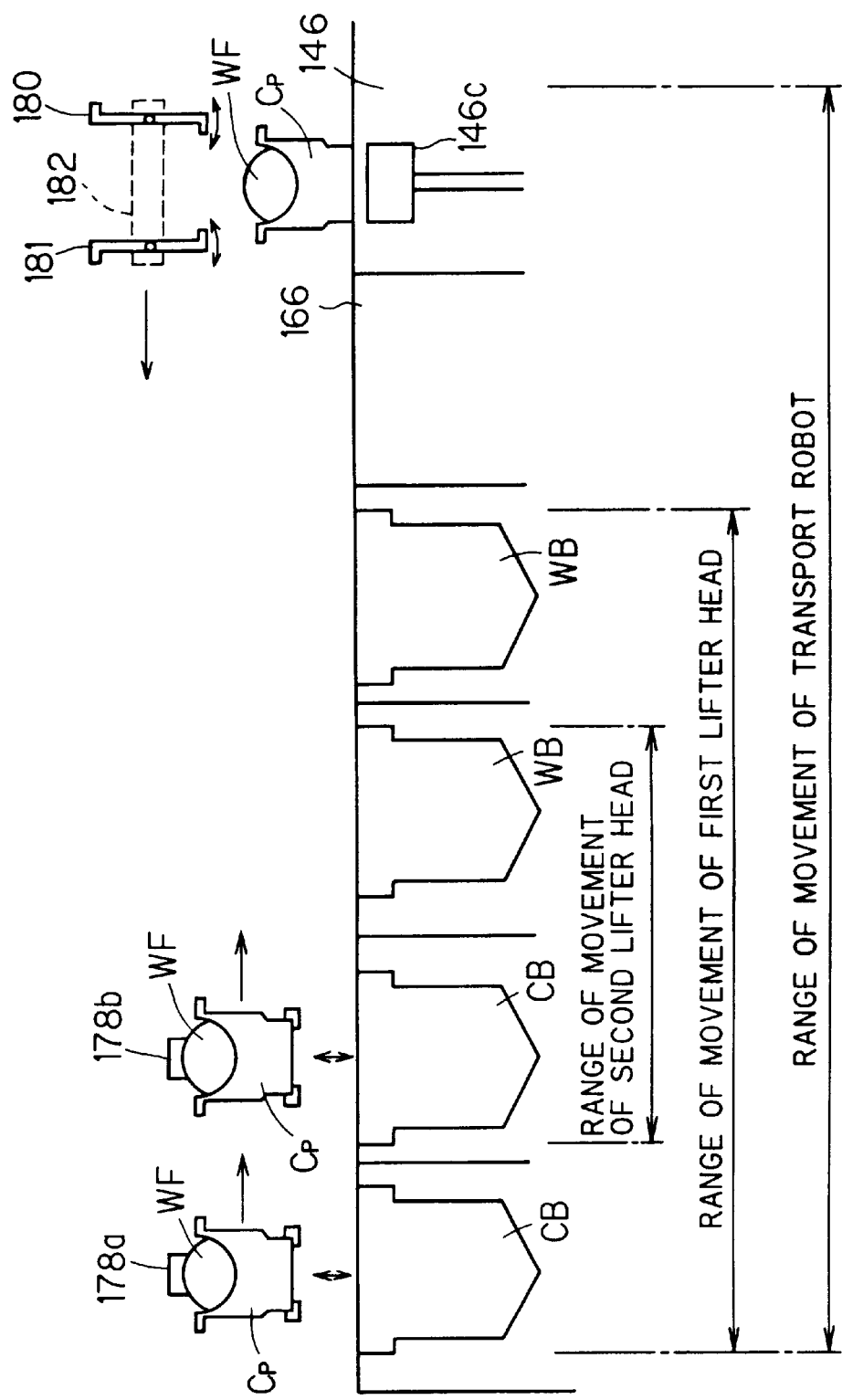
FIG. 21 is a diagram showing a front side structure of a substrate processing apparatus according to an eleventh preferred embodiment.

FIG. 21 is a diagram showing a front side structure of a substrate processing apparatus according to an eleventh preferred embodiment. The eleventh tenth preferred embodiment is modification of the tenth preferred embodiment.

Although the substrate processing apparatus according to the eleventh preferred embodiment is identical to the tenth preferred embodiment in comprising two processing units where each processing unit consists of adjacent chemical liquid bath CB and one water rinsing bath WB, in the eleventh preferred embodiment, one of the processing units is to an outer side with a distance from the other processing unit which is located at the center. A first substrate dipping mechanism which includes the first carrier holding member 178a is disposed to the processing unit of the outer side. A second substrate dipping mechanism which includes the second carrier holding member 178b is disposed to the processing unit which is located at the center. To prevent the first and the second carrier holding members 178a and 178b from interfering each other, while the first carrier holding member 178a moves to the side, the height of a lower edge of the first carrier holding member 178a is set higher than an upper edge of the second carrier holding member 178b to a certain extent by locating the second carrier holding member 178b within either one of the baths CB and WB or otherwise appropriately.

Now, an operation will be briefly described. The processing carrier $C_p$ housing unprocessed substrates WF is pushed upward by the holder 146c, and held by and handed over to the pair of hands 180, 181. The processing carrier $C_p$ which is held by the pair of hands 180, 181 is transported in the horizontal direction and handed over to the first carrier holding member 178a. The processing carrier $C_p$ which is held by the first carrier holding member 178a is dipped into the chemical liquid bath CB (i.e., the outer bath on the left-hand side in FIG. 21) so that the substrates WF within the processing carrier $C_p$ are processed with a chemical liquid. The processing carrier $C_p$ is dipped into the water rinsing bath WB which is disposed with a distance from the chemical liquid bath CB (i.e., the outer bath on the right-hand side in FIG. 21) so that the substrates WF are rinsed with water. Next, after handed over to the pair of hands 180, 181 from the first carrier holding member 178a, the processing carrier $C_p$ as it houses water-rinsed substrates WF is handed over to the second carrier holding member 178b. The processing carrier $C_p$ which is held by the second carrier holding member 178b is dipped into another chemical liquid bath CB (i.e., the left one of the baths at the center in FIG. 21) so that the substrates WF are processed with a chemical liquid. The processing carrier $C_p$ is dipped into another adjacent water rinsing bath WB (i.e., the right-hand side one of the baths at the center in FIG. 21) so that the substrates WF are rinsed with water. Next, the processing carrier $C_p$ as it houses water-rinsed substrates WF is handed over to the pair of hands 180, 181 from the second carrier holding member 178b. Following this, the processing carrier $C_p$ which is held by the pair of hands 180, 181 is transferred into the drying part 166 so that the substrates WF are dried. The processing carrier $C_p$ housing the dried substrates WF is handed over to the pair of hands 180, 181, and through cooperation with the holder 146c, the processing carrier $C_p$ is transferred into the second substrate handing part 146.

<Twelfth Preferred Embodiment>

Figure 22:
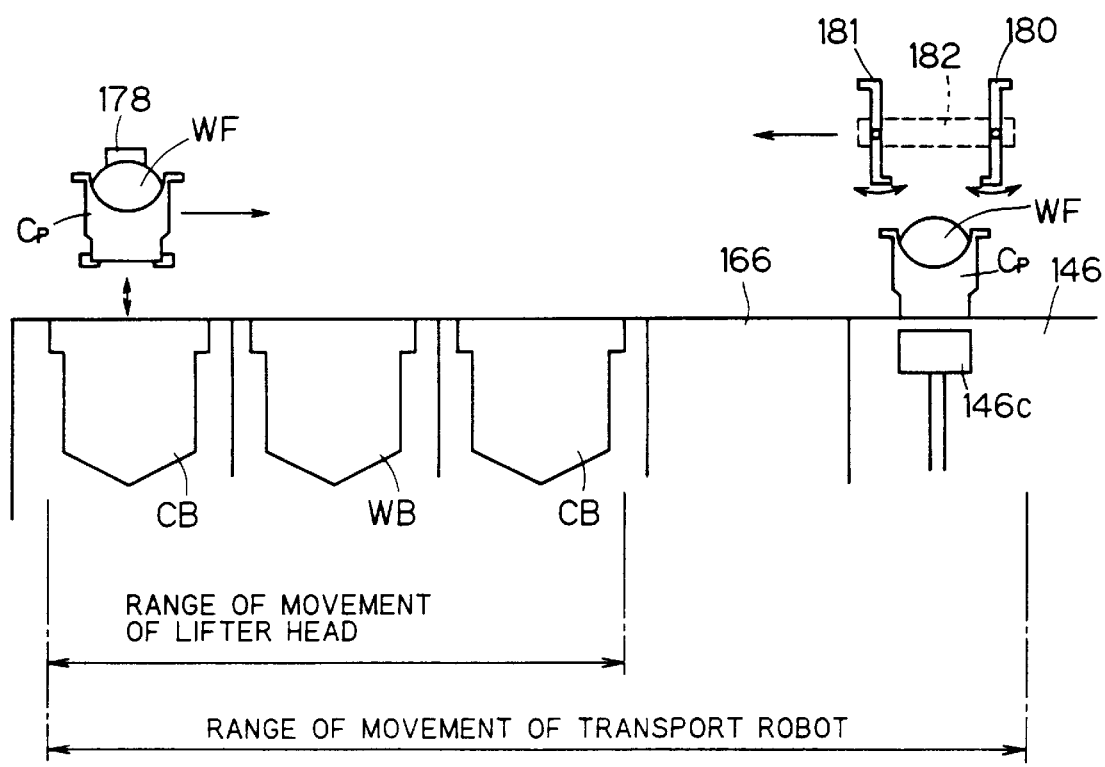
FIG. 22 is a diagram showing a front side structure of a substrate processing apparatus according to a twelfth preferred embodiment.

FIG. 22 is a diagram showing a front side structure of a substrate processing apparatus according to a twelfth preferred embodiment. The twelfth preferred embodiment is modification of the ninth preferred embodiment.

The substrate processing apparatus according to the twelfth preferred embodiment comprises only one processing unit which consists of two chemical liquid baths CB and one water rinsing bath WB. The two chemical liquid baths CB are disposed on the both sides of the water rinsing bath WB. This processing unit includes a substrate dipping mechanism having the carrier holding member 178 which moves to the side across the entire processing unit.

Now, an operation will be briefly described. The processing carrier $C_p$ housing substrates WF is pushed upward by the holder 146c, and held by and handed over to the pair of hands 180, 181. The processing carrier $C_p$ which is held by the pair of hands 180, 181 is transported in the horizontal direction and handed over to the carrier holding member 178. After dipped into the chemical liquid bath CB (i.e., the outer bath on the left-hand side in FIG. 22) so that the substrates WF are processed with a chemical liquid, the processing carrier $C_p$ which is held by the carrier holding member 178 is dipped into the adjacent water rinsing bath WB so that the substrates WF are rinsed with water. Next, the processing carrier $C_p$ as it houses water-rinsed substrates WF is dipped into another chemical liquid bath CB (i.e., the outer bath on the right-hand side in FIG. 22) so that the substrates WF are processed with a chemical liquid. The processing carrier $C_p$ is dipped into the same water rinsing bath WB which is located next to the another chemical liquid bath CB so that the substrates WF are rinsed with water. Next, the processing carrier $C_p$ as it houses water-rinsed substrates WF is handed over to the pair of hands 180, 181 from the carrier holding member 178. Following this, the processing carrier $C_p$ which is held by the pair of hands 180, 181 is transferred into the drying part 166 so that the substrates WF are dried. The processing carrier $C_p$ housing the dried substrates WF is handed over to the pair of hands 180, 181, and through cooperation with the holder 146c, the processing carrier $C_p$ is transferred into the second substrate handing part 146.

<Thirteenth Preferred Embodiment>

Figure 23:
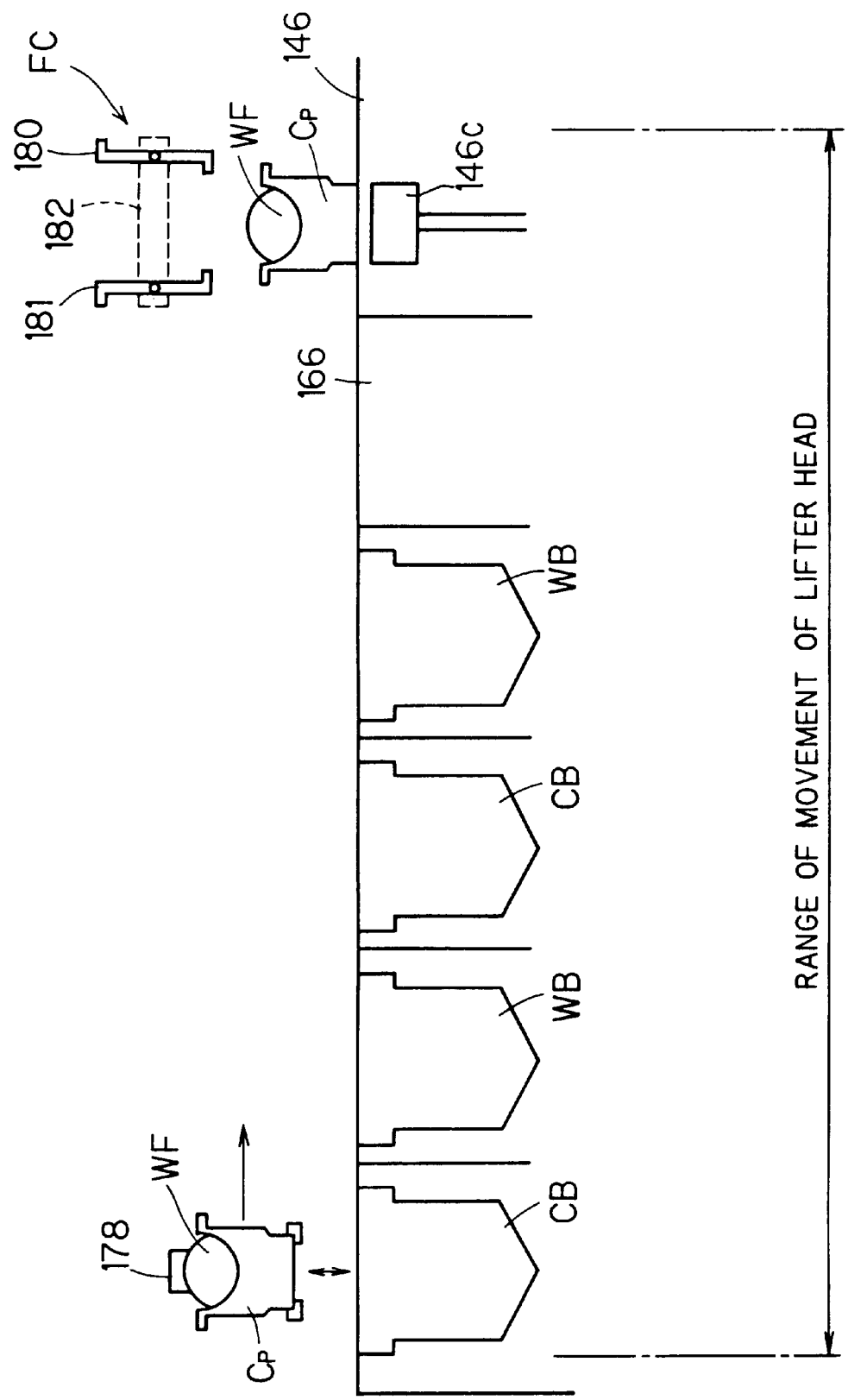
FIG. 23 is a diagram showing a front side structure of a substrate processing apparatus according to a thirteenth preferred embodiment.

FIG. 23 is a diagram showing a front side structure of a substrate processing apparatus according to a thirteenth preferred embodiment. The thirteenth preferred embodiment is modification of the ninth preferred embodiment.

The substrate processing apparatus according to the thirteenth preferred embodiment comprises two processing units where each processing unit consists of adjacent chemical liquid bath CB and one water rinsing bath WB. The processing units include a substrate dipping mechanism which includes the carrier holding member 178 which moves to the side across the processing units. Further, a fixing chuck FC is disposed instead of the carrier transport mechanism 108. The drying part 166 is modified so as to receive the processing carrier $C_p$ which is held by the carrier holding member 178 without interfering with the carrier holding member 178.

The fixing chuck FC opens and closes the pair of hands 180, 181 which is disposed to a head 182 only to hold the processing carrier $C_p$, but does not transport the processing carrier $C_p$.

Now, an operation will be briefly described. The processing carrier $C_p$ housing substrates WF is pushed upward by the holder 146c, and held by and handed over to the pair of hands 180, 181. Next, the carrier holding member 178 is moved below the fixing chuck FC, so that the processing carrier $C_p$ which is held by the pair of hands 180, 181 is handed over to the carrier holding member 178. The processing carrier $C_p$ which is held by the carrier holding member 178 is dipped into the chemical liquid bath CB (i.e., the outer bath on the left-hand side in FIG. 23) so that the substrates WF are processed with a chemical liquid. The processing carrier $C_p$ is then dipped into the adjacent water rinsing bath WB (i.e., the left one of the baths at the center in FIG. 23) so that the substrates WF are rinsed with water. Next, the processing carrier $C_p$ as it houses water-rinsed substrates WF is dipped into another chemical liquid bath CB (i.e., the right-hand side one of the baths at the center in FIG. 23) so that the substrates WF are processed with a chemical liquid. The processing carrier $C_p$ is dipped into another water rinsing bath WB which is adjacent the chemical liquid bath CB (i.e., the outer bath on the right-hand side in FIG. 23) so that the substrates WF are rinsed with water. The processing carrier $C_p$ as it houses water-rinsed substrates WF is handed over to the pair of hands 180, 181 from the carrier holding member 178, and transferred into the drying part 166 so that the substrates WF are dried. The processing carrier $C_p$ housing the dried substrates WF is handed over to the pair of hands 180, 181 through the carrier holding member 178, and through cooperation with the holder 146c, the processing carrier $C_p$ is transferred into the second substrate handing part 146.

<Fourteenth Preferred Embodiment>

Figure 24:
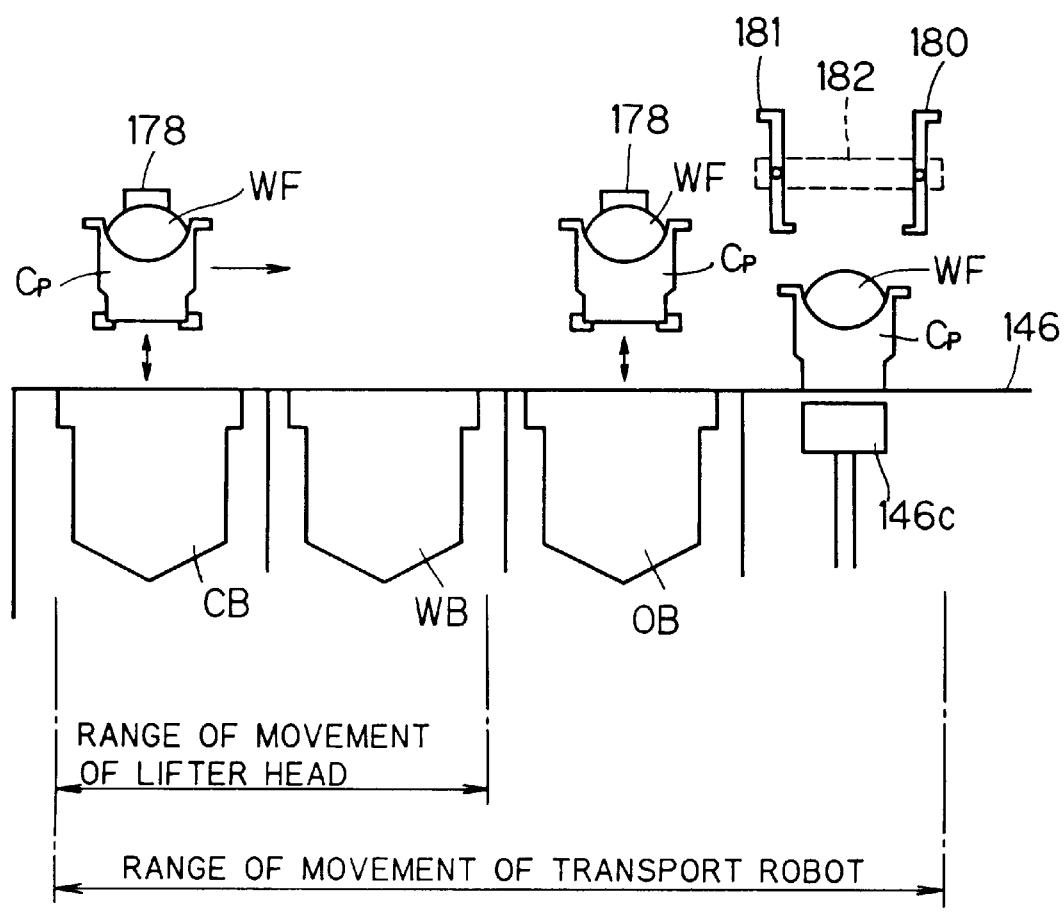
FIG. 24 is a diagram showing a front side structure of a substrate processing apparatus according to a fourteenth preferred embodiment.

FIG. 24 is a diagram showing a front side structure of a substrate processing apparatus according to a fourteenth preferred embodiment. The fourteenth preferred embodiment is modification of the ninth preferred embodiment.

The substrate processing apparatus according to the fourteenth preferred embodiment comprises a processing unit, which consists of adjacent chemical liquid bath CB and one water rinsing bath WB, and the multi-function processing bath OB in which chemical liquid processing, water rinsing processing and drying are performed. In the multi-function processing bath OB, substrates WF are lifted up from water under reduced pressure after the final water rinsing, so as to dry the substrates WF. A substrate dipping mechanism which includes the carrier holding member 178 which can move to the side is disposed to the processing unit which consists of the baths CB and WB. Another substrate dipping mechanism which includes the carrier holding member 178c which can move only in the vertical direction is disposed to the multi-function processing bath OB side.

Now, an operation will be briefly described. The processing carrier $C_p$ housing substrates WF is pushed upward by the holder 146c, and held by and handed over to the pair of hands 180, 181. Next, the carrier holding member 178 which is held by the pair of hands 180, 181 is transported in the horizontal direction and handed over to the carrier holding member 178. After dipped into the chemical liquid bath CB so that the substrates WF are processed with a chemical liquid, the processing carrier $C_p$ which is held by the carrier holding member 178 is dipped into the adjacent water rinsing bath WB so that the substrates WF are rinsed with water. Next, the processing carrier $C_p$ as it houses the water-rinsed substrates WF is handed over to the pair of hands 180, 181 from the carrier holding member 178 of the lifter head, and further from the pair of hands 180, 181 to the carrier holding member 178c. Following this, the processing carrier C$_p$ which is held by the carrier holding member 178c is dipped into the processing bath OB together with the water-rinsed substrates WF so that the substrates WF are sequentially processed with various types of chemical liquids and rinsed with water. The substrates WF are rinsed with water by final cleaning, dried under reduced pressure, and handed over to the pair of hands 180, 181. Lastly, the processing carrier C$_p$ housing the dried substrates WF is handed over to the pair of hands 180, 181, and through cooperation with the holder 146c, the processing carrier C$_p$ is transferred into the second substrate handing part 146.

Although the foregoing has described the present invention in relation to the ninth to the fourteenth preferred embodiments, the present invention is not limited to the ninth to the fourteenth preferred embodiments. Rather, it is possible to combine a plurality of the various types of the processing units as described in relation to the preferred embodiments above, i.e., those consisting of two baths of one chemical liquid bath CB and one water rinsing bath WB or those consisting of three or more baths including these baths CB and a water rinsing bath WB, and those including substrate dipping mechanisms which include the carrier holding members 178, 178a, 178b which move to the side along the entire range of the substrate dipping mechanism, depending on the necessity. This eliminates the necessity of cleaning the pair of hands 180, 181 at each stage of processing substrates WF, even when various types of substrate processing are necessary.

While the invention has been described in detail, the foregoing description is in all aspects illustrative and not restrictive. It is understood that numerous other modifications and variations can be devised without departing from the scope of the invention.

We claim:

1. A substrate processing apparatus, comprising:
   a processing bath for processing a substrate with one or more processing chemicals to carry out a chemical processing operation;
   a rinsing bath for rinsing said substrate with water to carry out a rinsing operation;
   a dipping mechanism for serially (1) dipping said substrate into said processing bath and holding said substrate in said processing bath during said chemical processing operation and (2) dipping said substrate into said rinsing bath and holding said substrate in said rinsing bath during said rinsing operation; and
   a transfer mechanism for transferring said substrate to said dipping mechanism before said chemical processing and water rinsing operations are carried out and for receiving said substrate from said dipping mechanism after said chemical processing and water rinsing operations have taken place, said transfer mechanism having a range of movement which is greater than the range of movement of said dipping mechanism.

2. The substrate processing apparatus of claim 1, wherein said transfer mechanism and said dipping mechanism directly hold said substrate.

3. The substrate processing apparatus of claim 2, wherein said transfer mechanism includes a pair of handling parts, and each one of said handling parts can hold the substrate.

4. The substrate processing apparatus of claim 1, wherein said transfer mechanism and said dipping mechanism each are capable of holding a plurality of substrates through a carrier in which a plurality of substrate holding grooves are formed.

5. The substrate processing apparatus of claim 4, wherein said transfer mechanism includes a pair of handling parts, and said pair of handling parts can hold a carrier.

6. The substrate processing apparatus of claim 2, wherein said dipping mechanism includes a holding part which holds said substrate which is received from said transfer mechanism within any one of said processing and rinsing baths, said dipping mechanism can move said holding part in a vertical direction between a first retrieval position above said processing bath and a first dipping position within said processing bath, said dipping mechanism can move said holding part in the vertical direction between a second retrieval position above said rinsing bath and a second dipping position within said rinsing bath, and said dipping mechanism can move said holding part reciprocally between said first and second retrieval positions.

7. The substrate processing apparatus of claim 6, further comprising:
   a second processing bath for processing said substrate with one or more processing chemicals;
   a second rinsing bath for rinsing the substrate with water; and
   a dipping mechanism, said dipping mechanism including a holding part for holding said substrate which is received from said transfer mechanism within any one of said second processing baths and said second rinsing bath, said holding part moving in the vertical direction between a third retrieval position above said second processing bath and a third dipping position within said second processing bath, said holding part moving in the vertical direction between a fourth retrieval position above said second rinsing bath and a fourth dipping position within said second rinsing bath, and said holding part reciprocally moving between said third and said fourth retrieval positions.

8. The substrate processing apparatus of claim 6, further comprising a third processing bath for processing the substrate with a processing chemical;
   wherein said dipping mechanism can move said holding part in the vertical direction between said first retrieval position above said first processing bath and said first dipping position within said first processing bath, said dipping mechanism can move said holding part in the vertical direction between said second retrieval position above said first rinsing bath and said second dipping position within said first rinsing bath, said dipping mechanism can move said holding part in the vertical direction between a third retrieval position above said second processing bath and a third dipping position within said processing bath, and said dipping mechanism can move said holding part reciprocally between said first, said second and said third retrieval positions.

9. The substrate processing apparatus of claim 4, wherein said dipping mechanism includes a holding part which holds said substrate which is received from said transfer mechanism within any one of said first and said second processing baths, said dipping mechanism can move said holding part in a vertical direction between a first retrieval position above said first processing bath and a first dipping position within said first processing bath, said dipping mechanism can move said holding part in the vertical direction between a second retrieval position above said first rinsing bath and a second dipping position within said first rinsing bath, and said dipping mechanism can move said holding part reciprocally between said first and said second retrieval positions.

10. The substrate processing apparatus of claim 9, further comprising:

a second processing bath for chemically processing substrates which are housed in the carrier with a chemical;

a second rinsing bath for rinsing substrates which are housed in said carrier with water; and a dipping mechanism including a holding part for holding said carrier which is received from said transfer mechanism within any one of said second processing bath and said second rinsing bath; and said dipping mechanism can move said holding part in the vertical direction between a third retrieval position above said second processing bath and a third dipping position within said second processing bath, said dipping mechanism can move said holding part in the vertical direction between a fourth retrieval position above said second rinsing bath and a fourth dipping position within said second rinsing bath, and said dipping mechanism can move said holding part reciprocally between said third and said fourth retrieval positions.

11. The substrate processing apparatus of claim 9, further comprising a second chemical processing bath for chemically processing substrates which are housed in said carrier, wherein said dipping mechanism can move said holding part as it holds the carrier in the vertical direction between said first retrieval position above said first processing bath and said first dipping position within said first processing bath, said dipping mechanism can move said holding part as it holds the carrier in the vertical direction between said second retrieval position above said first rinsing bath and said second dipping position within said first rinsing bath, said dipping mechanism can move said holding part as it holds the carrier in the vertical direction between a third retrieval position above said second processing bath and a third dipping position within said second processing bath, and said dipping mechanism reciprocally can move said holding part as it holds the carrier between said first, said second and said third retrieval position.

12. The substrate processing apparatus of claim 7, wherein said first processing bath and said first rinsing bath are disposed adjacent to each other, said second processing bath and said second rinsing bath are disposed adjacent to each other, and said first rinsing bath and said second processing bath are disposed adjacent to each other.

13. The substrate processing apparatus of claim 10, wherein said first processing bath and said first rinsing bath are disposed adjacent to each other, said second processing bath and said second rinsing bath are disposed adjacent to each other, and said first rinsing bath and said processing baths are disposed adjacent to each other.

14. The substrate processing apparatus of claim 7, wherein said said second processing bath and said second rinsing bath are disposed adjacent to each other, said first processing bath is disposed adjacent to said second processing bath, and said first rinsing bath is disposed adjacent to said second processing bath.

15. The substrate processing apparatus of claim 10, wherein said second processing bath and said second rinsing bath are disposed adjacent to each other, said first processing bath is disposed adjacent to said second processing bath, and said first rinsing bath is disposed adjacent to said second rinsing bath.

16. A substrate processing apparatus, comprising:

at least one chemical processing bath, each of said at least one chemical processing baths for carrying out a respective chemical processing operation on a substrate; and a multi-function processing bath for carrying out at least two of (1) one or more chemical processing operations on said substrate, (2) a water rinsing operation on said substrate and (3) a drying operation on said substrate.

17. The substrate processing apparatus of claim 16, further comprising:

a dipping mechanism for serially dipping said substrate into said chemical processing bath and said multi-function processing bath; and a transfer mechanism for handling over the substrate to said dipping mechanism and receiving said substrate from said dipping mechanism.

18. The substrate processing apparatus of claim 16, further comprising water rinsing bath for rinsing said substrate which is processed with a chemical within said chemical processing bath with water.

19. The substrate processing apparatus of claim 18, further comprising:

a first dipping mechanism for serially dipping the substrate into said chemical processing bath and said water rinsing bath;

a second dipping mechanism for dipping the substrate into said multi-function processing bath; and a transfer mechanism for handing over said substrate to each of said first and second dipping mechanisms and receiving said substrate from said dipping mechanism.

20. The substrate processing apparatus of claim 17, wherein said transfer mechanism and said dipping mechanism directly hold said substrate.

21. The substrate processing apparatus of claim 19, wherein said transfer mechanism and each of said first and second dipping mechanism directly hold the substrate.

22. The substrate processing apparatus of claim 17, wherein said transfer mechanism and said dipping mechanism hold a plurality of substrates through a carrier in which a plurality of substrate holding grooves are formed.

23. The substrate processing apparatus of claim 19, wherein said transfer mechanism and each of said first and second dipping mechanism hold a plurality of substrates through a carrier in which a plurality of substrate holding grooves are formed.

24. The substrate processing apparatus of claim 20, wherein said dipping mechanism includes a holding part for holding the substrate which is received from said transfer mechanism within any one of said chemical processing bath and said multi-function processing bath, said dipping mechanism can move said holding part in the vertical direction between a first retrieval position above said chemical processing bath and a first dipping position within said chemical processing bath, said dipping mechanism can move said holding part in the vertical direction between a second retrieval position above said multi-function processing bath and a second dipping position within said multi-function processing bath, and said dipping mechanism reciprocally can move said holding part between said first and said second retrieval positions.

25. The substrate processing apparatus of claim 21, wherein each of said first and second dipping mechanisms includes a holding part for holding said substrate which is received from said transfer mechanism within any one of said chemical processing oath and said multi-function processing bath, said first dipping mechanism can move said holding part in the vertical direction between a first retrieval position above said chemical processing bath and a first dipping position within said chemical processing bath and can move said holding part in the vertical direction between a second retrieval position above said water rinsing bath and a second dipping position within said water rinsing bath, said second dipping mechanism can move said holding part in the vertical direction between a third retrieval position above said multi-function processing bath and a third dipping position within said multi-function processing bath, and said first dipping mechanism reciprocally can move said holding part between said first and said second retrieval positions.

26. The substrate processing apparatus of claim 22, wherein said dipping mechanism includes a holding part for holding said carrier which is received from said transfer mechanism within any one of said chemical processing bath and said multi-function processing bath, said dipping mechanism can move said holding part in the vertical direction between a first retrieval position above said chemical processing bath and a first dipping position within said chemical processing exclusive bath, said dipping mechanism can move said holding part in the vertical direction between a second retrieval position above said multi-function processing bath and a second dipping position within said multi-function processing bath, and said dipping mechanism reciprocally can move said holding part between said first and said second retrieval positions.

27. The substrate processing apparatus of claim 23, wherein each of said first and second dipping mechanism includes a holding part for holding said carrier which is received from said transfer mechanism within any one of said chemical processing bath and said multi-function processing bath, said first dipping mechanism can move said holding part in the vertical direction between a first retrieval position above said chemical processing bath and a first dipping position within said chemical processing bath and can move said holding part in the vertical direction between a second retrieval position above said water rinsing bath and a second dipping position within said water rinsing bath, said second dipping mechanism can move said holding part in the vertical direction between a third retrieval position above said multi-function processing bath and a third dipping position within said multi-functiON processing bath, and first said dipping mechanism reciprocally can move said holding part between said first and said second retrieval positions.

28. The substrate processing apparatus of claim 16, wherein said multi-function processing bath dries said substrate.

29. The substrate processing apparatus of claim 28, wherein said multi-function processing bath can dry said substrate with a pressure lower than atmospheric pressure.

30. The substrate processing apparatus of claim 16, further comprising:
a circulation mechanism for discharging a chemical from said chemical processing bath and for supplying the discharged chemical into said chemical processing bath, said temperature adjusting means adjusting the temperature of a chemical.

31. The substrate processing apparatus of claim 30, wherein said chemical processing bath performs chemical processing using a acid liquid whose temperature is higher than 100° C.

32. The substrate processing apparatus of claim 30, wherein said chemical processing bath performs chemical processing using material selected from the group consisting of mixture of sulfuric acid and a hydrogen peroxide liquid, phosphoric acid, sulfuric acid and nitric acid.

33. The substrate processing apparatus of claim 30, wherein said chemical processing bath performs chemical processing using buffered hydrofluoric acid.

34. The substrate processing apparatus of claim 1, wherein said transfer mechanism does not enter either said processing bath or said rinsing bath.

35. The substrate processing apparatus of claim 1, wherein said dipping mechanism moves said substrate into and out of said baths and said substrate is transferred between said transfer mechanism and said dipping mechanism while said substrate is located outside of said baths.

36. The substrate processing apparatus of claim 35, wherein said transfer mechanism does not enter either said processing bath or said rinsing bath.

37. The substrate processing apparatus of claim 1, wherein said transfer mechanism transfers said substrate between one or more substrate holders and said dipping mechanism.

38. The substrate processing apparatus of claim 1, wherein said processing bath only carries out a single chemical process.

39. The substrate processing apparatus of claim 1, wherein said ranges of movement are measured along an imaginary line extending between said processing bath and said rinsing bath.

40. The substrate processing apparatus of claim 39, wherein said dipping mechanism moves said substrate between said processing bath and said rinsing bath along a first path and said transfer mechanism moves along a second path which runs generally parallel to said first path.

41. The substrate processing apparatus of claim 1, wherein said transfer mechanism has a range of movement which extends across said processing bath and said rinsing bath.

42. The substrate processing apparatus of claim 41, wherein said processing and rinsing baths are aligned along a first path and said transfer mechanism transfers said substrate to said dipping mechanism at one side of said path and receives said substrate from said dipping mechanism at an opposite side of said path.

43. The substrate processing apparatus of claim 4, wherein said holding part of said dipping mechanism is operable to receive said substrate from said transfer mechanism at said first retrieval position and a said second retrieval position and operable to hand over the substrate to said transfer mechanism at said first retrieval position and said second retrieval position.

44. The substrate processing apparatus of claim 16, further including a rinsing bath for rinsing said substrate with water so as to carry out a water rinsing operation.

* * * * *